(12) United States Patent
Wall et al.

(10) Patent No.: US 11,041,936 B1
(45) Date of Patent: *Jun. 22, 2021

(54) AUTONOMOUSLY RECONFIGURABLE SURFACE FOR ADAPTIVE ANTENNA NULLING

(71) Applicant: HRL Laboratories, LLC, Malibu, CA (US)

(72) Inventors: Walter S. Wall, Santa Monica, CA (US); Amit M. Patel, Santa Monica, CA (US); Ryan G. Quarfoth, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 327 days.

This patent is subject to a terminal disclaimer.

(21) Appl. No.: 16/152,341

(22) Filed: Oct. 4, 2018

(51) Int. Cl.
*H01Q 3/26* (2006.01)
*G01S 7/02* (2006.01)
(Continued)

(52) U.S. Cl.
CPC .............. *G01S 7/023* (2013.01); *H01Q 1/42* (2013.01); *H01Q 9/16* (2013.01); *H04K 3/22* (2013.01);
(Continued)

(58) Field of Classification Search
CPC ....... H04B 3/32; H04L 1/0002; H04L 1/0025; H04L 1/0033; H04L 1/0036;
(Continued)

(56) References Cited

U.S. PATENT DOCUMENTS 3,768,044 A 10/1973 Henry
4,126,866 A 11/1978 Pelton
(Continued)

OTHER PUBLICATIONS

U.S. Appl. No. 15/706,100, filed Sep. 15, 2017, Wall.
(Continued)

*Primary Examiner* — Timothy A Brainard
(74) *Attorney, Agent, or Firm* — Ladas & Parry

(57) ABSTRACT

An autonomously reconfigurable surface for adaptive antenna nulling includes a lattice of electrically conductive elements (which may be embodied as crossed metallic dipoles) mounted on a thin and preferably conformal surface and aperiodically loaded with reactance tuning elements and/or RF (and typically high power) sensing circuits. Additional elements mounted on this surface include analog to digital convertors (ADCs), digital to analog convertors (DACs), and microcontroller(s). The analog outputs of the DACs are networked to reactance tuning elements via, for example, a network of thin copper traces. The analog inputs of the ADCs are networked to the RF sensing circuits via a network, for example, of thin copper traces. The digital outputs of ADCs and the digital inputs of DACs are networked to microcontroller(s) via a network, for example, of thin copper traces. An embodiment of the adaptive nulling surface can be mounted over antennas and apertures as a retrofit antenna cover or as an overlay applied to existing radomes or over a new design antenna. Once exposed to a high power radio frequency radiation, this surface determines the direction of the incident high power source and adaptively adjusts the reactance of tuning elements in the surface to reconfigure the radiation pattern of the antenna which it is covering to place a null in the direction of the interference while allowing normal operation at other angles.

30 Claims, 15 Drawing Sheets

(51) Int. Cl.
*H01Q 1/42* (2006.01)
*H01Q 9/16* (2006.01)
*H04K 3/00* (2006.01)
*H05K 1/18* (2006.01)

(52) U.S. Cl.
CPC ......... *H05K 1/181* (2013.01); *H04K 2203/32* (2013.01); *H05K 2201/10098* (2013.01)

(58) Field of Classification Search
CPC ............ H04M 11/062; H04M 3/2209; H04M 3/2227; Y02D 30/50
See application file for complete search history.

(56) References Cited

U.S. PATENT DOCUMENTS

| | | | |
|---|---|---|---|
| 5,652,631 | A | 7/1997 | Bullen |
| 5,958,557 | A | 9/1999 | Naor |
| 6,028,565 | A | 2/2000 | Mackenzie |
| 6,473,054 | B1 | 10/2002 | Lopez |
| 7,088,308 | B2 | 8/2006 | Delgado |
| 8,890,765 | B1 | 11/2014 | Dinh |
| 8,963,774 | B1 | 2/2015 | Livadaru |
| 9,972,901 | B2 | 5/2018 | Lavin |
| 10,056,690 | B2 * | 8/2018 | Tegreene ............. H04B 7/0413 |
| 10,199,722 | B2 | 2/2019 | Stratis |
| 10,573,963 | B1 * | 2/2020 | Wall ..................... H01Q 3/2617 |
| 2004/0008153 | A1 | 1/2004 | Lamensdorf |
| 2004/0227687 | A1 | 11/2004 | Delgado |
| 2004/0263420 | A1 | 12/2004 | Werner |
| 2005/0078048 | A1 | 4/2005 | Delgado |
| 2007/0080887 | A1 | 4/2007 | Ho |
| 2009/0096857 | A1 | 4/2009 | Frisco |
| 2009/0195361 | A1 | 8/2009 | Smith |
| 2010/0284086 | A1 | 11/2010 | Novack |
| 2010/0295749 | A1 | 11/2010 | Vanliere |
| 2015/0263436 | A1 * | 9/2015 | Chakam .................. H01Q 9/30 343/797 |
| 2016/0268676 | A1 * | 9/2016 | Chang ...................... H01Q 3/06 |
| 2016/0380345 | A1 | 12/2016 | Kolak |
| 2017/0133754 | A1 | 5/2017 | Raeker |
| 2017/0187101 | A1 | 6/2017 | Freeman |
| 2017/0230598 | A1 * | 8/2017 | Takayanagi ....... H01L 27/14812 |
| 2017/0317426 | A1 * | 11/2017 | Park ....................... H01Q 9/285 |
| 2017/0347050 | A1 * | 11/2017 | Sakakibara ........ H04N 5/37455 |
| 2018/0115086 | A1 | 4/2018 | Olfert |
| 2018/0358696 | A1 * | 12/2018 | Shapoury ............. H01Q 25/002 |

OTHER PUBLICATIONS

U.S. Appl. No. 13/562,492, Colburn.
From U.S. Appl. No. 15/706,100, filed Sep. 15, 2017, non publication requested), Application and Office Actions.
Lau, et al., "A Planar Reconfigurable Aperture with Lens and Reflectarray Modes of Operation" IEEE Transactions on Microwave Theory and Techniques, vol. 58, No. 12, Dec. 2010, pp. 3547-3555.
Mias, C., "Varactor-tunable frequency selective surface with resistive-lumped-element biasing grids," IEEE Microwave and Wireless Components Letters, vol. 15, No. 9. (Sep. 2005), pp. 570-572.
Mautz, J.R., "Modal Analysis of Loaded N-Port Scatterers," IEEE Transactions on Antennas and Propagation, vol. 21, No. 2, 1973, pp. 188-199.
Sun, C. et al., "Fast Beamforming of Electronically Steerable Parasitic Array Radiator Antennas: Theory and Experiment," IEEE Transactions on Antennas and Propagation, vol. 52, No. 7, Jul. 2004, pp. 1819-1832.
From U.S. Appl. No. 15/706,100 (now U.S. Pat. No. 10,573,963), Notice of Allowance dated Sep. 9, 2019.

* cited by examiner

AUTONOMOUSLY RECONFIGURABLE SURFACE FOR ADAPTIVE ANTENNA NULLING

CROSS REFERENCE TO RELATED APPLICATIONS

This application is related to U.S. patent application Ser. No. 15/706,100 filed on Sep. 15, 2017 and entitled "ADAPTIVE NULLING METASURFACE RETROFIT" the disclosure of which is hereby incorporated herein by reference.

STATEMENT REGARDING FEDERALLY SPONSORED RESEARCH OR DEVELOPMENT

None.

TECHNICAL FIELD

The present disclosure is directed in general to the field of antennas and in particular to adaptive antenna nulling.

BACKGROUND OF THE DISCLOSURE

A variety of technologies for mitigating high power interference for antennas are known. Some of these approaches include conventional diode limiters which prevent damage to receivers when illuminated by high power radiation sources by shorting the input of the receiver. However, that approach also prevents the receiver from receiving incoming signals while exposed to the external high power source. See, for example, R. Henry et al "Passive Limiter for High-Frequency Waves" U.S. Pat. No. 3,768,044.

There are other approaches that use an array of electronically controlled parasitic scatters coupled to a central feed antenna to selectively null different sectors in the radiation pattern of the antenna by switching binary loads on or off at the parasitic scatters, but they do so by a trial and error method and are failure prone as they do not try to locate the bearing of the high-power incident waves. These approaches also do not provide for appropriate switching mechanisms to handle high power incident waves without failure.

Other techniques designed to mitigate interferers do so by notching a portion of the frequency spectrum on which the interferer is operating, and do not provide for means to mitigate interferers which are in-band or operating at the same frequency as the receiver.

To overcome the deficiencies of these other technologies, antenna technology could well utilize a radome for existing antennas which can autonomously identify the bearing of a high-power threat and subsequently null that threat without replacing the existing antenna and/or modifying existing hardware or software. Of course, a radome which can autonomously identify the bearing of a high-power threat and subsequently null that threat may also be utilized with new design antenna as well.

SUMMARY OF THE DISCLOSURE

One embodiment described in this disclosure provides for an autonomously reconfigurable null providing surface comprising an array of electrically conductive elements, such as crossed dipoles, mounted on a substrate, reactive tuning elements sparsely distributed and located between selected pairs of electrically conductive elements and electrically connected to the selected pairs of electrically conductive elements on both ends of each reactive tuning element and electrically connected to one or more microcontroller(s) mounted on the substrate, wherein the one or more microcontroller(s) control the tuning elements to provide nulls in a direction pointing to interferers, while allowing normal operation at other directions.

Another embodiment discloses an antenna system comprising a radiating aperture and a reconfigurable surface radome placed on top of the radiating aperture that comprises of an array of elements, such as crossed dipoles, mounted on a substrate, tuning elements sparsely distributed and located between the crossed dipoles and electrically connected to the crossed dipoles on both ends, and one or more microcontroller(s) mounted on the substrate, wherein the one or more microcontroller(s) control the tuning elements to provide nulls in a direction pointing to interferers while allowing normal operation at other angles.

Another embodiment discloses a method of adaptive nulling for an antenna system comprising mounting a surface radome on top of a radiating aperture, mounting an array of elements, such as crossed dipoles, on a substrate forming the radiating aperture, distributing tuning elements sparsely between some of the crossed dipoles and electrically connecting the tuning elements to the crossed dipoles and mounting one or more microcontroller(s) on the substrate, wherein the one or more microcontroller(s) control the tuning elements to provide nulls in a direction pointing to interferers while allowing normal operation at other angles.

Certain embodiments may provide various technical advantages depending on the implementation. For example, a technical advantage of some embodiments may include the capability to provide adaptive antenna nulling Other embodiments may include autonomous reconfiguration of the surface to adapt to moving interferers.

The terms "sparse", "sparsely" or "sparseness" and "aperiodic" and "autonomous" appear in this disclosure. In the context of the present application, the terms "sparse", "sparsely" and "sparseness" refer to the degree to which a lattice or an array is fully populated or underpopulated. The locations in the disclosed arrays (lattices) are occupied (or not) by RF sensors and/or reactance tuning elements. "Sparseness" applies to both the RF sensors and the reactance tuning elements in the disclosed arrays (lattices). The reactance tuning elements are preferably tuned using circuit elements which exhibit reactance. "Aperiodic" refers to the fact that the different values of reactance may be developed by the reactance tuning elements and to the fact that the reactance tuning elements are non-uniformly distributed in the lattice or array. "Autonomous" refers to the fact that the reactance tuning elements do not necessarily require input or data from an external source to set the reactances of their reactive circuit elements, rather the the reactance tuning elements are preferably controlled by nearby or adjacently disposed microcontroller(s).

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like or similar parts:

FIGS. 2-1 and 2-2 provide an overall view of an embodiment of the disclosed system. FIG. 2-1 illustrates an application where an autonomous reconfigurable surface is mounted as a radome on top of an existing antenna to protect the antenna from RF energy emitted by one or more interfering RF sources; portion 2a of FIG. 2-2 illustrates an aperiodic grid of subwavelength elements sparsely loaded with a combination high power sensing and tuning circuits, according to an embodiment of the present disclosure; portion 2b of FIG. 2-2 is similar to FIG. 2-1 and illustrates an application where an autonomous reconfigurable surface is mounted as a radome on top of an existing antenna, according to an embodiment of the present disclosure; portion 2c of FIG. 2-2 illustrates a simplified high power tuning circuit used in the autonomous reconfigurable surface, according to an embodiment of the present disclosure; and Portion 2d of FIG. 2-2 illustrates a simplified high power sensing circuit used in the autonomous reconfigurable surface, according to an embodiment of the present disclosure;

DETAILED DESCRIPTION

Figure 1:
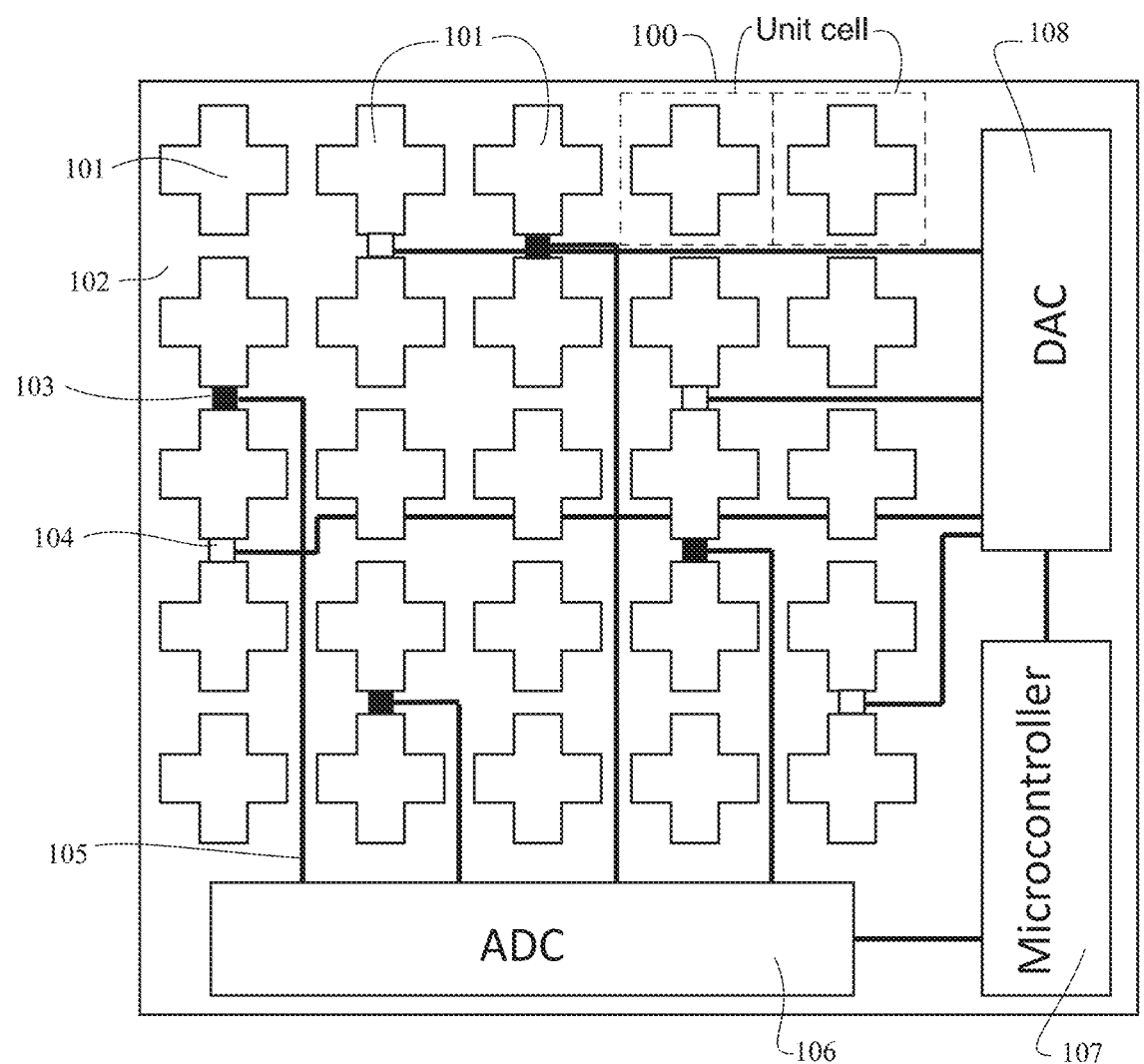
FIG. 1 illustrates a system overlay of an autonomous reconfigurable null providing surface according to an embodiment of the present disclosure.

It should be understood at the outset that, although exemplary embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

To overcome the deficiencies of the prior art, inventive concepts are described herein to provide for autonomously reconfigurable surfaces for adaptive antenna nulling. The disclosed technology offers the possibility of a standalone retrofit solution for existing microwave systems to enable normal operation in the presence of in-band high power microwave attacks. Of course, the present invention is not limited to using in a retrofit application and thus some practicing the present invention may choose to utilize it in connection with newly designed radar and/or communication equipment and facilities.

Many receivers intended for navigation, communications, and sensing, are designed to operate with maximum sensitivity to allow for increased standoff range and improved fidelity. However, this increased sensitivity also makes these receivers particularly vulnerable to jamming and electronic attack. In the case of High Power Microwave (HPM) weapons, this vulnerability is even more significant as many tactical functions of these receivers can be denied at substantial ranges with modest power levels. While out-of-band HPM attacks can be mitigated using filters, in-band microwave attacks cannot be mitigated without compromising the performance of the aperture. For these in-band attacks, conventional antennas can be replaced with adaptive nulling arrays as described here or reconfigurable antennas. These systems determine the angle of arrival (AOA) of an incident jammer and adaptively null the pattern of an antenna in the direction of the HPM attack. However, in most cases, achieving this functionality requires substantial modifications to existing infrastructure (i.e. replacement of existing antennas and receivers), which for many legacy platforms is undesirable.

An important feature of this invention is to provide a conformal surface which can be retrofit or overlaid on or over existing antennas or existing radomes to autonomously blank or null a sector or sectors in their radiation patterns to deny high power sources radiating towards these antennas or radomes from damaging or desensitizing sensitive electronics in the receiver and thus allow the receiver to continue operating without damage and preferably without desensitization. Compared to previous adaptive nulling systems which require modification or replacement of existing RF hardware, the disclosed technology enables adaptive nulling functionality to be retrofitted on existing platforms without external control inputs or modifications to the platform, thus minimizing recertification costs.

This document includes numerous embodiments of autonomously reconfigurable surfaces for adaptive antenna nulling Elements which either are identical or are very similar in function often share the reference numeral between these embodiments to avoid an unnecessary repetition of their descriptions. For example, an initial embodiment is described with reference to FIG. 1 and an application of an autonomously reconfigurable surface for adaptive antenna nulling is described with reference to FIG. 2-1. Additional embodiments are described thereafter with their descriptions focusing more on the differences between the embodiments than the similarities. Elements which are either identical or very similar in terms of their function in the additional embodiments (compared to the embodiment of FIG. 1 and also FIG. 2-1) share the same reference numerals with little or no additional description needed to understand the additional embodiments.

Figure 11:
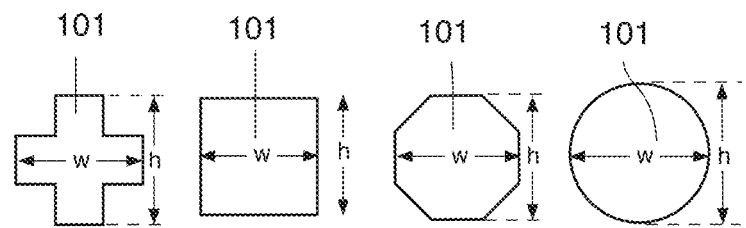
FIG. 11 depicts alternative shapes of the metallic elements.

An embodiment of the null providing surface 100 for adaptive antenna nulling is shown in FIG. 1 and comprises a lattice or array of electrically conductive elements 101. In this embodiment the electrically conductive elements 101 (which are preferably metallic) appear in the shape of cross-shaped metallic dipoles, but other shapes for elements 101 may be adopted as is described below with reference to FIG. 11. The elements 101 may made of electrically conductive traces 105 (mentioned below) disposed on a thin, and preferably conformal, dielectric surface comprising a substrate 102 such as such as, but not limited, to Rogers RO4003, Rogers RO3003, Rogers RO5880, Kapton, or Polyethylene Terephthalate (known commonly as PET). These substrates are often available with an integral copper layer and that copper layer may be patterned to provide the aforementioned conductive traces which form, among other things, lattice or array of elements 101.

The substrate 102 is aperiodically loaded with reactance tuning elements 104 and with RF power sensors 103. Moreover, the numbers of reactance tuning elements 104 and numbers of RF power sensors 103 in this 5×5 array are sparse as will be explained in greater detail below. One or more analog to digital convertors (ADCs) 106, one or more digital to analog convertors (DACs) 108, and one or more microcontroller(s) 107 are also preferably mounted on this substrate 102 and all interconnected as needed via the electrically conductive traces 105. The traces 105 (including the array of elements 101) may be defined from a copper clad substrate 102 using printed circuit fabrication techniques to define those traces and elements in the aforementioned copper. So the electrically conductive traces 105 and the lattice or array of elements 101 as well as the various interconnections between the ADC(s) 106, DAC(s) 108 and the microcontroller(s) 107 may be defined by patterning (etching) the copper of a copper clad substrate 102. Of course, the material which is electrically conductive and defining the electrically conductive traces 105 and the lattice or array of elements 101 as well as the various interconnections may be some material other than copper, but copper is convenient and inexpensive material to utilize for these purposes. The lattice or array of electrically conductive elements 101 could be quite small in some embodiments, in which case semiconductor integrated circuit fabrication techniques could be used instead of the printed circuit board fabrication techniques previously alluded to.

Figure 12:
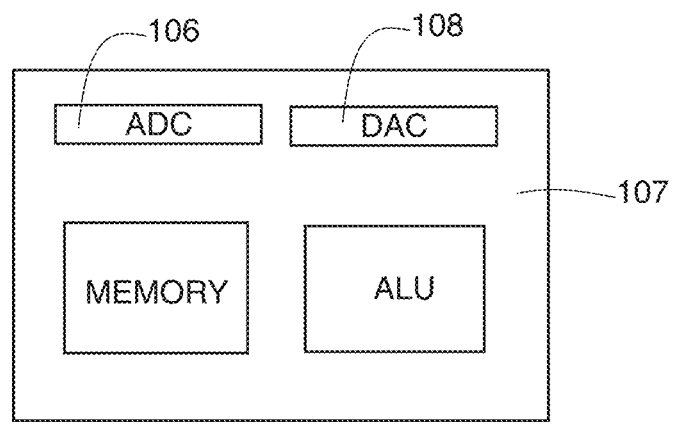
FIG. 12 represents a microcontroller with an on board ADC and an on board DAC, an on board ALU (Arithmetic Logic Unit) and an on board memory for storing, for example, the firmware program of FIG. 13.

The microcontroller(s) 107 may be implemented, for example, by a small computing device such as the ATmega1280 microcontroller made by Microchip Technology Inc. of Chandler, Ariz. The ADC(s) 106 and DAC(s) 108 may be embodied in the microcontroller(s) 107 and therefor they need not be separate elements (see FIG. 12 which depicts an integrated microcontroller with an on board DAC, an on board ADC, an on board ALU and an on board memory for storing, for example, the firmware program of FIG. 13). The ADC(s) 106 and DAC(s) 108 are illustrated as separate elements from microcontroller(s) 107 in other figures merely for ease of illustration and explanation. These elements are bonded to the metal on substrate 102 after the it is patterned preferably using conventional printed circuit fabrication techniques unless they are all fabricated as a unit using semiconductor integrated circuit fabrication techniques.

The embodiment of null providing surface 100 depicted by FIG. 1 is a 5×5 array of unit cells (two of which are defined by dashed lines) with an electrically conductive element 101 possibly occupying each unit cell. Generally speaking, surfaces 100 may have many thousands of unit cells. FIG. 1 only shows a 5×5 array for ease of illustration. If the array of unit cells has M rows and N columns, then if the number of reactance tuning elements 104 is less than $(M-1)\times(N-1)$, then some possible places where a reactance tuning element 104 might occur has no reactance tuning element 104. Indeed, many of the possible places where a reactance tuning element 104 might occur will have no reactance tuning element 104 and the total number of reactance tuning elements 104 may be less than or equal to $\sqrt{M \times N}$ (the square root of M times N). Likewise, if the number of RF power sensors 103 is also less $(M-1)\times(N-1)$, then some possible places where a RF power sensor 103 might occur has no RF power sensor 103. Indeed, many of the possible places where a RF power sensor 103 might occur will have no RF power sensor 103 and the total number of RF power sensors 103 may be less than or equal to $\sqrt{M \times N}$ (the square root of M times N). If there are fewer reactance tuning elements 104 in the array than the array could otherwise accommodate, then the array of reactance tuning elements 104 is considered to be sparse. Likewise, if there are fewer RF power sensors 103 in the array than the array could otherwise accommodate, then the array of RF power sensors 103 is considered to be sparse.

In the embodiment of FIG. 1, the four reactance tuning elements 104 are depicted while four RF power sensors 103 are also depicted. Since each of those numbers is less than $(M-1)\times(N-1)$, where M and N both equal five, the number of reactance tuning elements 104 and the number of RF power sensors 103 are sparse according to either the $(M-1)\times(N-1)$ or the $\sqrt{M \times N}$ definitions given above. Indeed, the total number of RF power sensors 103 plus the total number of reactance tuning elements 104 is also less than $(M-1)\times(N-1)$.

The RF power sensors 103 and the reactance tuning elements 104 are preferably arranged aperiodically in the array, that is they preferably are not periodic. The may fall in an arrangement which may be called random or pseudo-random.

As will be seen, however, embodiments of null providing surface 100 are not necessarily flat and therefor the array of unit cells may not lay out in a nice rectangular grid as depicted by FIG. 1. Whether the number of reactance tuning elements 104 and the number of high power sensors 103 are sparse is then defined in terms of the total number of unit cells. If the number of reactance tuning elements 104 is less than the total number of unit cells and preferably less than $\sqrt{\text{TotalNumberofUnitCells}}$ then they are sparse. Likewise, if the number of RF power sensors 103 is less than the total number of unit cells and preferably less than $\sqrt{\text{TotalNumberofUnitCells}}$, then they are also sparse.

Figure 1A:
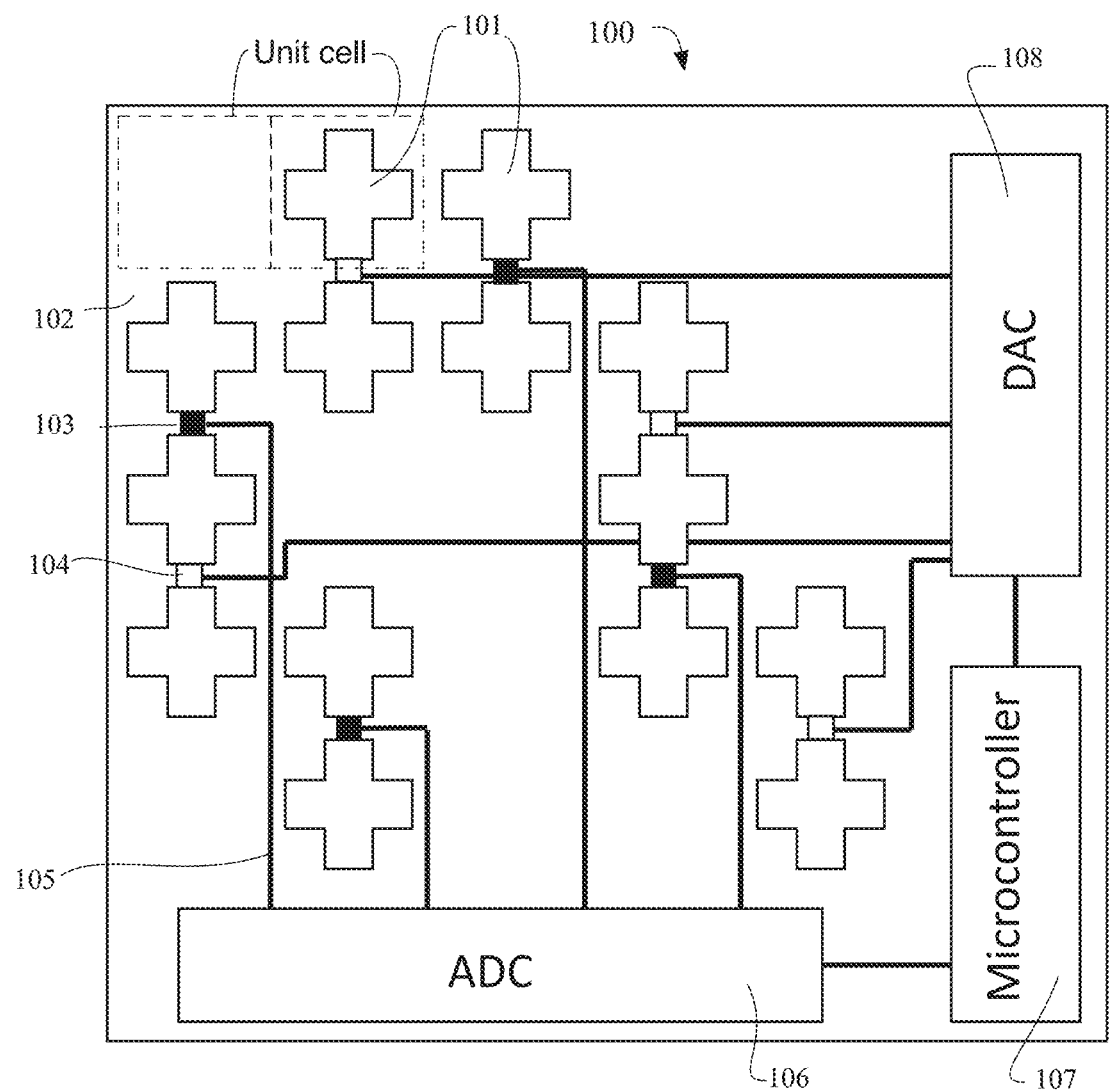
FIG. 1a is similar to FIG. 1 but unneeded conductive elements have been omitted.

If the embodiment of null providing surface 100 depicted by FIG. 1 is compared with the embodiment of null providing surface 100 depicted by FIG. 1a, in FIG. 1a electrically conductive elements 101 have been omitted from those units cells where, if they were otherwise present, are not coupled with either a reactance tuning element 104 or a RF power sensor 103. But omitting the electrically conductive elements 101 which are not connected to either a reactance tuning element 104 or a RF power sensor 103 thereby renders the array of electrically conductive elements 101 sparse.

The embodiments of FIGS. 1 and 1a utilizes a single substrate 102, but as will be described, other embodiments may utilize multiple substrates.

The analog outputs of the DACs 108 are networked to reactance tuning elements 104 via a first network of electrically conductive traces 105. The analog inputs of the ADCs 106 are networked to RF power sensors 103 via a second network of electrically conductive traces 105. The digital outputs of ADCs 106 and the digital inputs of DACs 108 are networked to microcontroller(s) 107 via a third network of electrically conductive traces 105. Of course, if either or both ADCs 106 and DACs 108 are embodied in the microcontroller(s) 107, then the traces 105 between them may be omitted as corresponding connections occur inside microcontroller 107.

The null providing surface 100 for adaptive antenna nulling may be disposed over or on existing antennas and apertures as a retrofit antenna cover or as a covering applied to, on or over existing radomes or the conformal null providing null providing surface 100 may be integrated into new design domes and radomes disposed over antennas and apertures. The null providing surface 100 is preferably conformal, meaning that it preferably preserves the correct angles between directions of impinging radio waves within small areas, but while this is a desirable feature, some utilizing the present invention may choose to forego it and utilize, instead, a planar embodiment of null providing surface 100. Once exposed to a high-power radio frequency radiation (which may be an interfering signal or signals, either intentional or unintentional), the microcontroller(s) 107 disposed on or adjacent the null providing surface 100 determine the direction of one or more of the incident high power sources of such signals (by sensing that power with RF sensors 103) and adaptively adjust the reactance of reactance tuning elements 104 in the surface to reconfigure the radiation or gain pattern of the antenna which it is covering, to place a null preferably in the direction(s) of each of the interfering signals while allowing normal operation at other angles. The interfering signals are called "high-power" herein because, if there are intentionally produced (to jam the existing antenna or aperture), then they are very apt to be of a higher power compared to signals of interest. But the interfering signal my also arise from a source which just happens to interfere, but intentionally so with the existing antenna or aperture, and such signals may be of a lower power, but still be objectionable, and the null providing surface 100 may be employed to null them out as well.

Figures 1, 2:
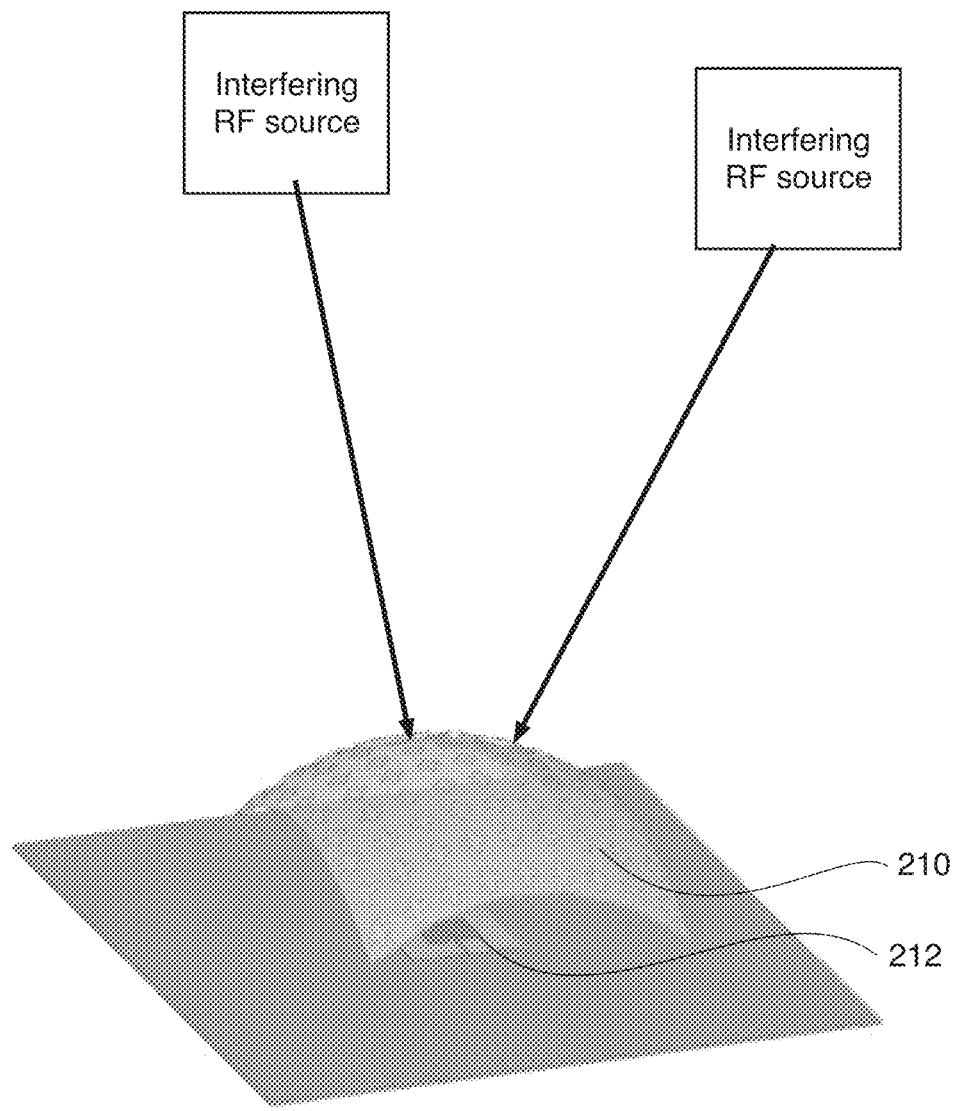
Figure 2:
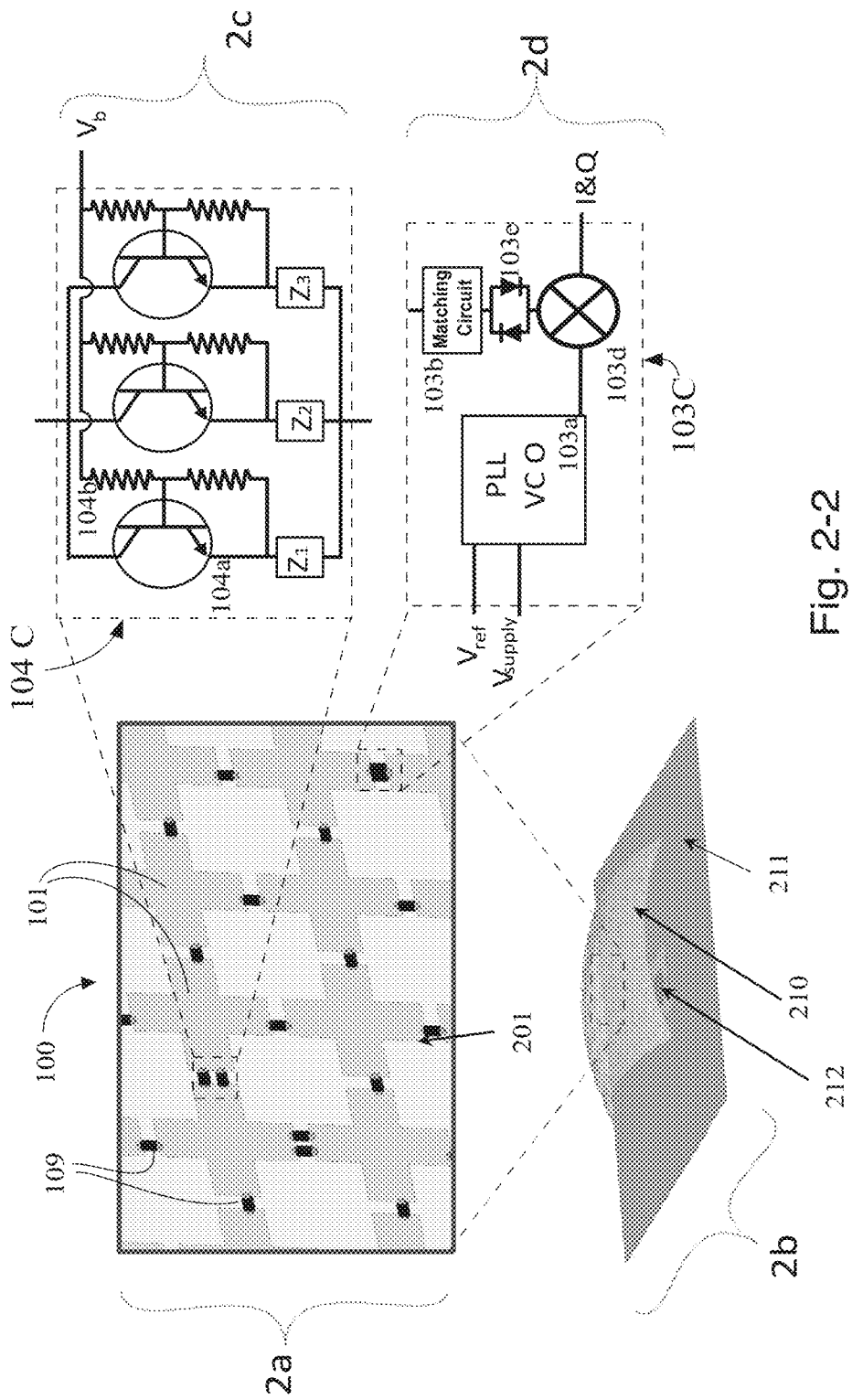

An important feature of this technology is illustrated in FIG. 2-1 of an embodiment of a null providing surface 100 for adaptive antenna nulling. The null providing surface 100 may be referred to from time to time as a "system" since it includes both a substrate 102 various components mounted thereon in addition to conductive traces 105 for interconnecting those components and forming elements 101 as is shown in greater detail by FIG. 1a. Null providing surface 100 may serve as a conformal element 210 which can be retrofitted (or back fit) over an existing antenna element 212 mounted on an existing surface 211. Alternatively, null providing surface 100 may be designed to function with (cooperate with) an antenna element 212 of new design (thus null providing surface 100 is not limited to use in retrofitting applications).

The null providing surface 100 preferably autonomously and adaptively nulls high power interferers 213 in the radiation environment of a receiver (not shown) preferably without modification to the antenna element 212 or the receiver connected to antenna element 212 and without the need for input (data) from external sensors or systems. Although the word element is used in the singular with respect to antenna element 212, those skilled in the art will appreciate that a receiving antenna element 212 which is to be protected from undesirable and possibly jamming RF sources may be comprises many different elements, some active and possibly some passive (such as an array of dipoles or patches. for example), or just a single element (such as a disk or horn type antenna, also for example).

FIG. 2-2 depicts various elements and embodiments of circuits preferably used in providing null providing surface 100 in greater detail.

The embodiment of the adaptive null providing surface 100 shown by FIGS. 1a and 2-2 comprises an array or lattice of conductive elements 101 (preferably embodied as cross-shaped metallic dipoles, but elements 101 my take other shapes as mentioned above and below) mounted on a thin conformal substrate 102 such as, but not limited to, Rogers RO4003, Rogers RO3003, Rogers RO5880, Kapton, or PET, and aperiodically loaded with reactance tuning elements 104 and/or RF power sensors 103. The conformal surface 102 may also have static capacitors 109, one or more ADC(s) 106, one or more DAC(s) 108, and one or more microcontroller(s) 107 mounted on it. As illustrated in FIG. 1, the analog outputs of the DAC(s) 108 are connected to reactance tuning elements 104 via a network of thin copper traces 105. The analog inputs of the ADC(s) 106 are connected to RF power sensors 103 via a network of thin copper traces 105. The digital outputs of ADC(s) 106 and the digital inputs of DAC(s) 108 are either connected to one or more microcontroller(s) 107 via a network of thin copper traces 105 and/or embodied in the microcontroller(s) 107 as previously discussed. Portion 2b of FIG. 2-2 illustrates how this conformal element 210 would preferably be mounted over an existing microstrip patch antenna 212.

Portion 2c of FIG. 2-2 illustrates an embodiment of a ractance tuning circuit 104C for embodying a reactance tuning element 104. This embodiment has three transistor switches 104a which may be selectively triggered on (or off) to switch in one or more of three possible reactances $Z_1$-$Z_3$ into parallel with each other and connecting the ends or arms of two adjacent elements 101.

Null steering is integrated into the disclosed structures by loading a sparse subset of unit cells or elements 101 with reactance tuning elements 104. These loadings can be implemented using either traditional varactor diodes or switched reactance banks, controlled by resistively or reactively loaded bias lines 104b, which preferably minimize RF loss through the surface. In the case of the switched reactance banks such as that shown at portion 2c of FIG. 2-2, these tuning elements $Z_1$-$Z_3$ can be implemented with high power COTS (Commercial Off the Shelf) GaN transistor switches 104a. Unlike Electronically Steerable Passive Array Radiator (ESPAR) and adaptive nulling arrays which utilize Si or GaAs components to achieve null steering, COTS GaN switches can withstand voltages up to 200 v.

This embodiment of a reactance tuning circuit 104C comprises of a set of parallel transistor switches 104a with their biasing network 104b, each transistor switch 104a being arranged in series with an impedance element $Z_1$ through $Z_3$. There may be, of course, more than three transistor switches 104a and more than three associated impedances Z in each reactance tuning circuit 104C. By controlling the switches, one can control how $Z_1$ through $Z_3$ are connected in parallel to yield a varying effective impedance between neighboring elements 101 required to tune the null providing surface 100. Several such reactance tuning circuits 104C can be placed in the radome surface as shown to provide the necessary notches to null the one or more high power interferers. With just three impedance element $Z_1$ through $Z_3$, the parallel connected impedance element $Z_1$ through $Z_3$ can be set to eight different impedances, which are preferably primary reactive, but some resistance will be inherently present.

Circuit 2d of FIG. 2-2 illustrates an embodiment of a RF power sensing circuit 103C for embodying a RF power sensor 103. The direction or bearing of high power interferers (and also even low power interferers) is determined using RF power sensing circuits 103C to implement the RF power sensors 103 integrated with a small subset of unit cells or elements 101 as shown in FIG. 1a. These RF power sensing circuits 103C are preferably implemented using phased locked voltage controlled oscillators (PLL VCO) 103a and mixers 103d, which return relative phase and amplitude measurements (I&Q) from distinct points in the system 100 to an integrated microcontroller 107 as illustrated in FIG. 1a. These vector measurements representing the phase and amplitude of an interfering source can then either be correlated with a known array manifold to determine the angle of arrival (AOA) or can be used with onboard optimization codes, such as those employed for ESPAR antennas, to iteratively null the interfering source in the environment. Furthermore, these RF power sensing circuits 103C are preferably implemented with integrated thresholding, allowing them to discriminate between incident high power threats and normal received signals. To ensure that these RF power sensing circuits 103C are capable of measuring an incident HPRF (High Power Radio Frequency) attack as well as surviving the large incident fields associated with an HPRF attack (>400V/m), multiple matching circuits 103b may be implemented in series with each sensing element 103e. These matching circuits 103b are used to ensure that enough voltage is dropped across the mixer 103d to perform direction finding for even low power attacks. For large attacks these circuits are preferably tuned to act as an attenuator, preventing an over-voltage condition at the mixer 103d. The circuit 2d of FIG. 2-2 illustrates an embodiment of a RF power sensing circuit 103C that can be used to sense the direction of the interferers. RF power sensing circuits 103C are preferably scattered at various locations in the array of elements 101 and each RF power sensing circuit 103C reports the amplitude and phase detected at each location, which is then fed via an ADC 106 to (or embodied in) microcontroller 107 to identify the AOA(s) of the incident interfering signal(s).

To ensure that this autonomously reconfigurable surface of the system 100 can be readily conformed to existing radomes and apertures, the elements 101 in this array should be significantly smaller than the aperture they are intended to protect. In many cases, this requirement means that these elements 101 need to be significantly smaller than the operating wavelength ($<\lambda/4$) of the communication or radar system being protected. Unlike previous approaches of conformal reconfigurable surfaces, such as active frequency selective surfaces (FSS) and metasurfaces, which utilize dense and fully populated grids of tuning elements to achieve full control over the radiation pattern of an antenna or an incident wave, the disclosed technology is implemented with as a sparse array of tuning elements since it needs only steer one or hopefully only a small number of nulls in the radiation pattern of an antenna. As such, only a small subset of the elements 101 are associated with or connected to reactance tuning elements 104. This sparse arrangement of tuning elements 104 allows the disclosed system 100 to achieve significantly lower insertion loss when inactive, compared to traditional active FSSs and metasurfaces where the tunable elements (often varactors) interconnect each and every neighboring metallic element.

Since most HPRF systems are linearly polarized, sensing and tuning elements may only need to operate in a single polarization, although this technology can also be made to respond to circular and elliptical polarizations (if need be) by providing RF power sensors 103 and reactance tuning elements 104 in both the vertical and horizontal gaps between elements 101. As will be noted by going back and again reviewing FIG. 1, the reactance tuning elements 104 and the RF sensors 103 only occur in the vertically oriented connections to the elements 101 in this figure since that embodiment is for a single linear polarization.

Furthermore, while FIG. 1 shows an element 101 disposed in every possible unit cell, the elements 101 may be omitted from unit cells where they do not directly couple to either a reactance tuning element 104 or a RF sensing element 103. See the embodiment of FIG. 1a where the unused elements 101 (that is, elements 101 of the embodiment of FIG. 1 are unconnected to either elements 103 or 104) are omitted in the embodiment of FIG. 1a from the array of elements 101. Of course, some unconnected elements 101 may be retained while others may be omitted, if desired.

Since the null providing surface 100 may be conformal in some embodiments, it may well be that omitting unused elements 101 from the array of elements 101 will make is simpler to define an array of elements 101 that can be conveniently arranged on a non-planar, conformal surface. In some embodiments, the array of elements 101 may be disposed on a planar surface.

The term "null" has been used above and those skilled in art should appreciate that the term "null" refers to reducing the gain of the antenna in the direction of the interfering source(s). The higher the amount of reduction, the greater the "null" is. "Null" does not necessarily mean the interfering source(s) are completely eliminated, although that would be a very desirable result if it could be obtained.

To demonstrate the feasibility of null steering and direction finding with a sparse array of electrically small elements 101, simulations of a 6×6 array of elements 101 (embodied as cross-shaped metallic dipoles) 36 mm away from an 1.5 GHz patch antenna (see FIG. 4) were performed in HFSS (High Frequency Simulation Software). This scenario is similar to using the disclosed null providing surface 100 with a small navigation antenna, for example, as opposed to a relatively larger radome for a radar receive antenna. Of course, the same concept can be scaled up to larger horn and parabolic reflector antennas commonly used in radar or other applications.

Figure 3A:
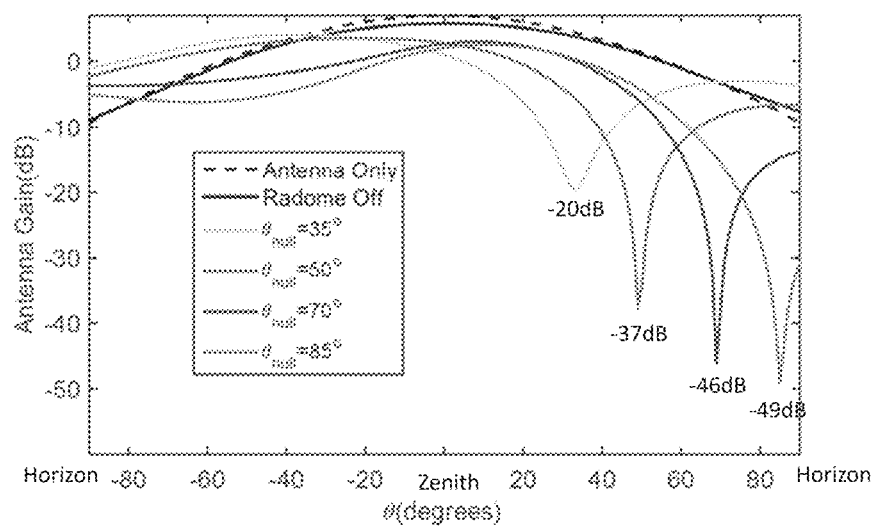
FIG. 3a illustrates simulation results of antenna gain as a function of azimuth angle of the radiating aperture, according to an embodiment of the present disclosure.
Figure 3B:
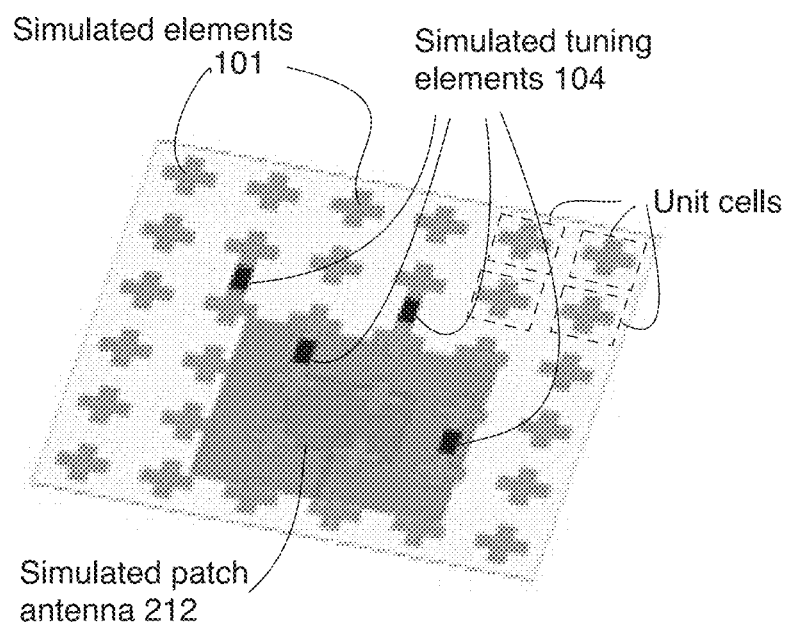
FIG. 3b illustrates a sparse arrangement of small electrically sensing and tuning elements to achieve a low loss conformal surface, according to an embodiment of the present disclosure

In the first part of this simulation, steerable nulls (>20 dB) were generated from zenith to horizon using only seven possible load values placed between four of the 36 elements 101 or unit cells in the array (as depicted by FIG. 3b, at locations 204). Using a network analysis technique similar to that developed by J. R. Mautz and R. F. Harrington (see "Modal Analysis of Loaded N-Port Scatterers" *IEEE Transactions on Antennas and Propagation*, Vol. 21, No. 2, 1973, incorporated herein by reference), load values for each of these four unit cells were determined to steer deep nulls (>20 dB) to five desired angles in the radiation pattern of the patch antenna. In addition to null steering, this simulation can also be used to demonstrate the integrated direction finding capability of the disclosed null providing surface 100. Voltage measurements from five different elements in the simulated surface were generated for an incident plane wave. Using a simulated array manifold, a correlation direction finding algorithm was implemented and used to demonstrate an average direction finding accuracy of +/−1.86° over a 100° field of view (FOV) (see FIG. 3*a*). FIG. 3*a* illustrates simulated performance characteristics of system 100 as embodied in FIG. 3*b*. The results of the simulated null steering can be seen in FIG. 3*a* for a simple autonomously reconfigurable surface (ARS) 300 that has been placed over a 1.5 GHz patch antenna 312 as illustrated in FIG. 3*b*. The surface 300 comprises of a six by six array of dipoles 301 with four integrated active tuning elements 304 as illustrated in FIG. 3*b*. Deep nulls are steered throughout the FOV (Field of View) of the ARS using a sparse array of tuning elements (four). When the radome is turned off, ARS generates a broad radiation pattern similar to the patch antenna in isolation (<1 dB insertion loss) as seen in FIG. 3*a*.

Figure 4:
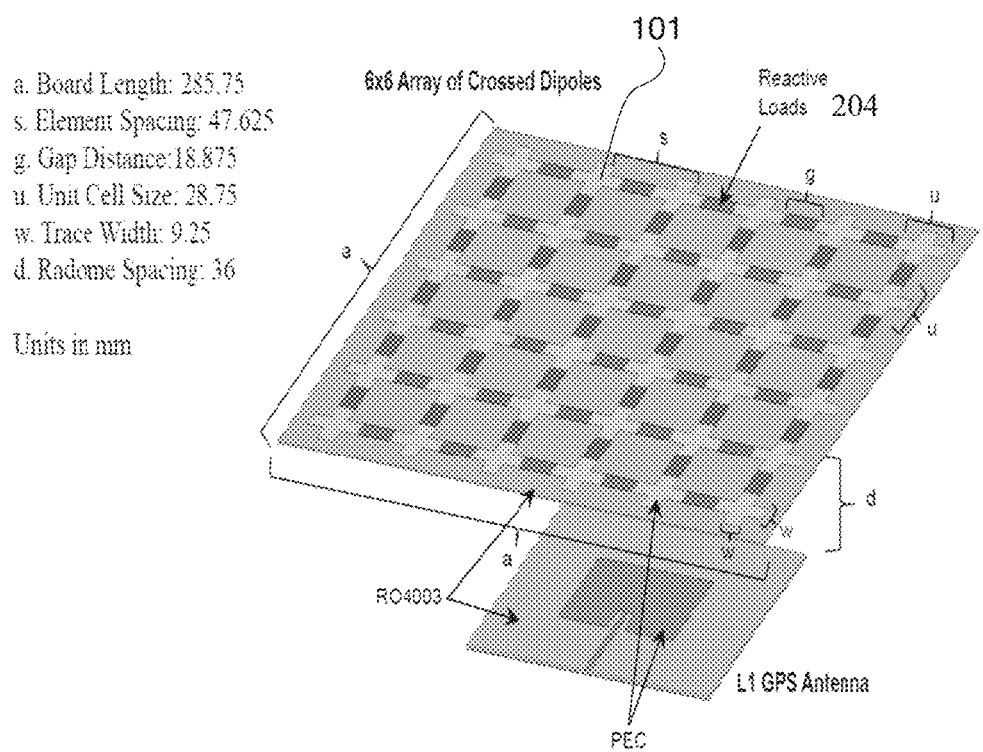
FIG. 4 illustrates a system design used for simulation of the antenna performance in FIG. 3a using a 6×6 array of discretely tuned crossed dipoles over an L1 Patch antenna, according to an embodiment of the present disclosure.

FIG. 4 illustrates an autonomously reconfigurable null providing surface 100 as simulated in more detail. To demonstrate the feasibility of null steering and direction finding with a sparse array of electrically tuned elements 104, in this illustrative embodiment, a 6×6 array of crossed metallic dipoles 101 are placed 36 mm away from a 1.5 GHz patch antenna 212 and the performance was simulated. The null providing surface 100 further comprised of a substrate 101 assumed to be made of RO4003 and the dipoles 101 and the patch antenna 212 were assumed to be etched in PEC (Perfect Electric Conductor) such as copper for the purposes of this simulation. The design dimensions are illustrated in FIG. 4. A perfect conductor or perfect electric conductor (PEC) is an idealized material exhibiting infinite electrical conductivity or, equivalently, zero resistivity. This scenario illustrates application of the disclosed technology to a small navigation antenna, although the same concept could readily be applied to larger horn and parabolic reflector antennas commonly used in radar applications.

As noted above, since most HPRF systems are linearly polarized, sensing and tuning elements are usually only required to operate in a single polarization, although this technology can also be made to respond to circular and elliptical polarizations by adding sensing and tuning elements in both the vertical and horizontal gaps between crosses. In the first part of this simulation, steerable nulls (>20 dB) were generated from zenith to horizon using only seven possible load values placed in four of the 36 unit cells in the array. Using a network analysis technique, load values for each of these four unit cells were determined to steer deep nulls (>20 dB) to five desired angles in the radiation pattern of the patch antenna (FIG. 3*a*). In addition to null steering, this simulation can also be used to demonstrate the integrated direction finding capability of the disclosed technology. Voltage measurements from five different elements in the disclosed technology were generated in simulation for an incident plane wave. Using a simulated array manifold, a correlation direction finding algorithm was implemented and used to demonstrate an average direction finding accuracy of +/−1.86° over a 100° field of view (FOV) (FIG. 3*a*).

Figure 5:
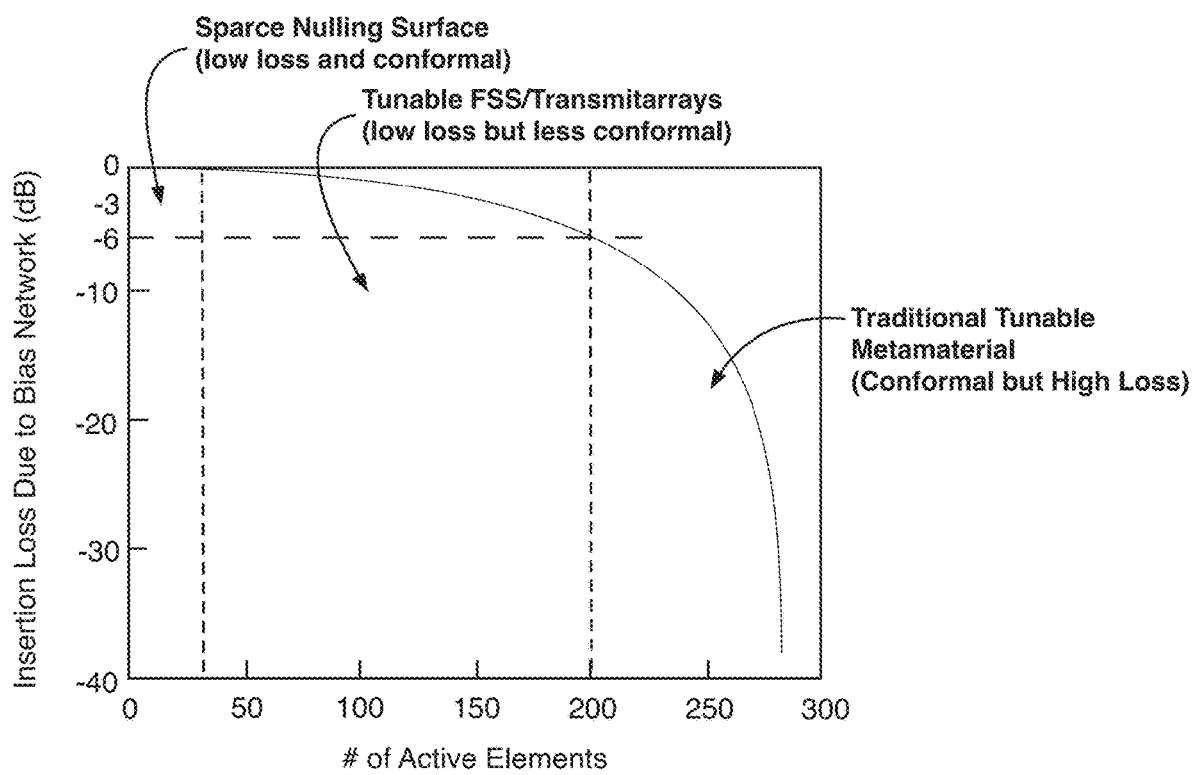
FIG. 5 illustrates simulation results of the effect of bias network on insertion loss as a function of number of active elements in the array, according to an embodiment of the present disclosure.

FIG. 5 is based on a simulation and illustrates the number of active elements typically used in traditional approaches such as tunable FSS or tunable metamaterial and the resulting insertion loss. The length of board used in the simulation for FIG. 5 was 286 mm as shown in FIG. 4. The simulation assumes that for each element added to the board one metallic line of 1 mm width is added to the back side of the board. The simulation also assumes that all lines are uniformly spaced. The aforementioned active elements are the sensing and/or tuning elements but since the simulation only considers the metallic line associated with the element the exact type of element used is not relevant for this simulation. Assuming each unit cell has one active element connecting to each of its neighbors, as the unit cell size shrinks (i.e. corresponding to a more densely packed board) so too does the number of metallic lines on the backside of the board in turn increasing the insertion loss through the board. Traditional conformal reconfigurable periodic surfaces, such as active frequency selective surfaces (FSS) and metamaterials, rely on a dense (fully populated) grid of tuning elements leading to high insertion losses of −6 dB or even much greater when the surface is not actively biased or tuned. To avoid this issue, the present invention utilizes a sparse distributed arrangement of electrically small RF sensors and reactance tuning elements (typically less than 25 active elements) to achieve a low loss (typically much less than −3 dB) conformal surface. The results illustrated in FIG. 5 assumes that all bias lines are oriented perpendicular to the polarization of the incident HPRF attack.

Figure 6A:
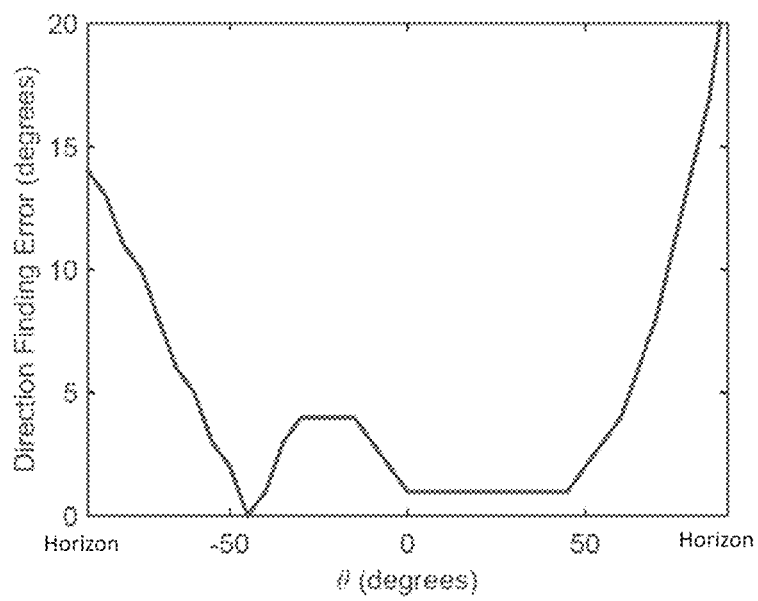
FIG. 6a illustrates simulated performance in terms of direction finding error, according to an embodiment of the present disclosure.
Figure 6B:
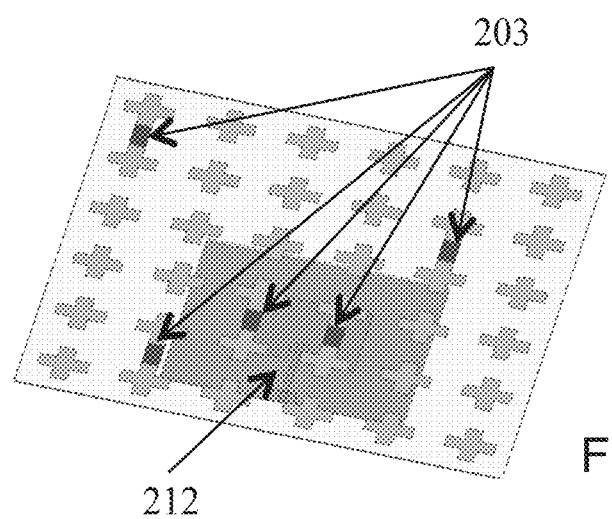
FIG. 6b illustrates a simple autonomously reconfigurable surface (ARS) placed over a 1.5 GHz patch antenna that is used for the simulation in FIG. 6a, according to an embodiment of the present disclosure.

FIG. 6*a* illustrates simulated performance measured in terms of error in direction finding of the incident high power interferer. FIG. 6*b* illustrates the model used for this simulation with four simulated sensing elements 203 on a surface comprising a 6×6 array of dipoles 101 placed over a 1.5 GHz patch antenna 212. Using a simulated array manifold, a correlation direction finding algorithm was implemented and used to demonstrate an average direction finding accuracy of +/−1.86° over a 100° FOV as can be seen in FIG. 6*a*.

Control and monitoring of the tuning and sensing elements on the null providing surface 100 is preferably accomplished by implementing a microcontroller 107, digital-to-analog converter (DAC) 108, and analog-to-digital converter (ADC) 106 on the surface 101 as illustrated in FIG. 1. Phase and amplitude measurements from the high-power sensing elements are processed by the ADC 106 and supplied to the microcontroller 107 as digital inputs. This information is then utilized with direction finding algorithms to determine the required bias voltages (supplied by the DAC 108) for each tuning element 104 to effectively null the source of any high-power interference. These control elements (ADCs, DACs and microcontroller(s)) are preferably placed on the periphery of the substrate 102 to minimize coupling and to easily interface with the tuning and sensing elements through a network of thin copper traces 105. To ensure that the DACs, ADCs, and microcontroller are capable of surviving the large incident fields associated with an HPRF attack (up to 800V/m), these elements are preferably hardened using EMI shields for control components as well as reactive and/or resistive loadings on all control and monitoring lines.

In another embodiment (see FIG. 7) of the surface 100 for adaptive antenna nulling, the null providing surface 100 comprises two distinct layers or substrates 102$_1$ and 102$_2$ which define the (possibly conformal) surface 210 for protecting antenna element 212. Each layer or substrate 102$_1$ and 102$_2$ is provided with a lattice or array of metallic elements 101 (preferably embodied as dipoles in this embodiment) mounted on a thin conformal substrate such as but not limited to Rogers RO4003, Rogers RO3003, Rogers RO5880, kapton, or PET. The metallic elements 101 may be omitted (as discussed with reference to FIG. 1*a*) from unit cells where they do not connect with reactance tuning elements 104 on layer or substrate 102₁ or do not connect with RF sensors 103 on layer or substrate 102₂.

Figure 7:
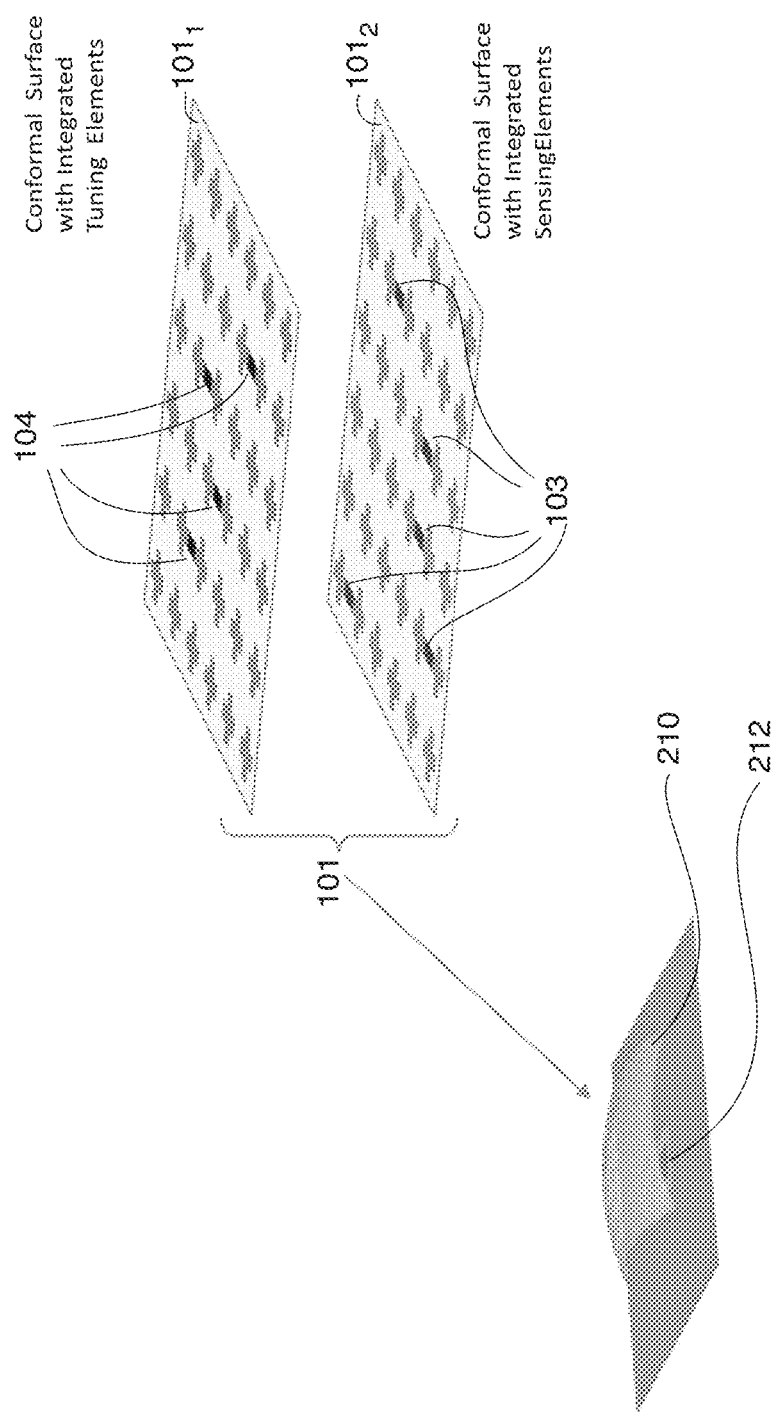
FIG. 7 depicts an embodiment of the surface for adaptive antenna nulling which comprises two distinct layers or substrates.
Figure 8A:
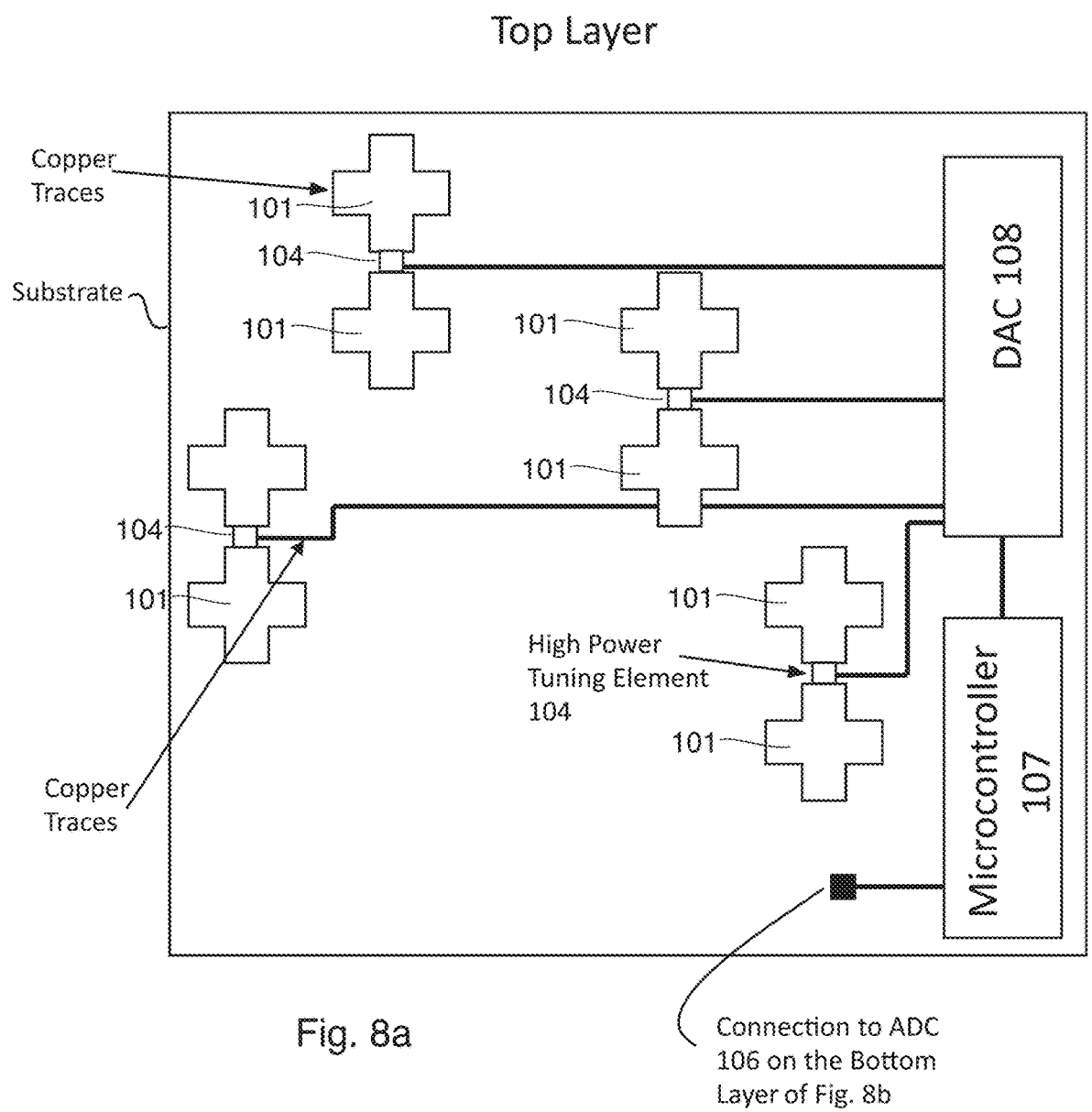
FIGS. 8a and 8b depict the two substrates of the embodiment of FIG. 7 in greater detail.
Figure 8B:
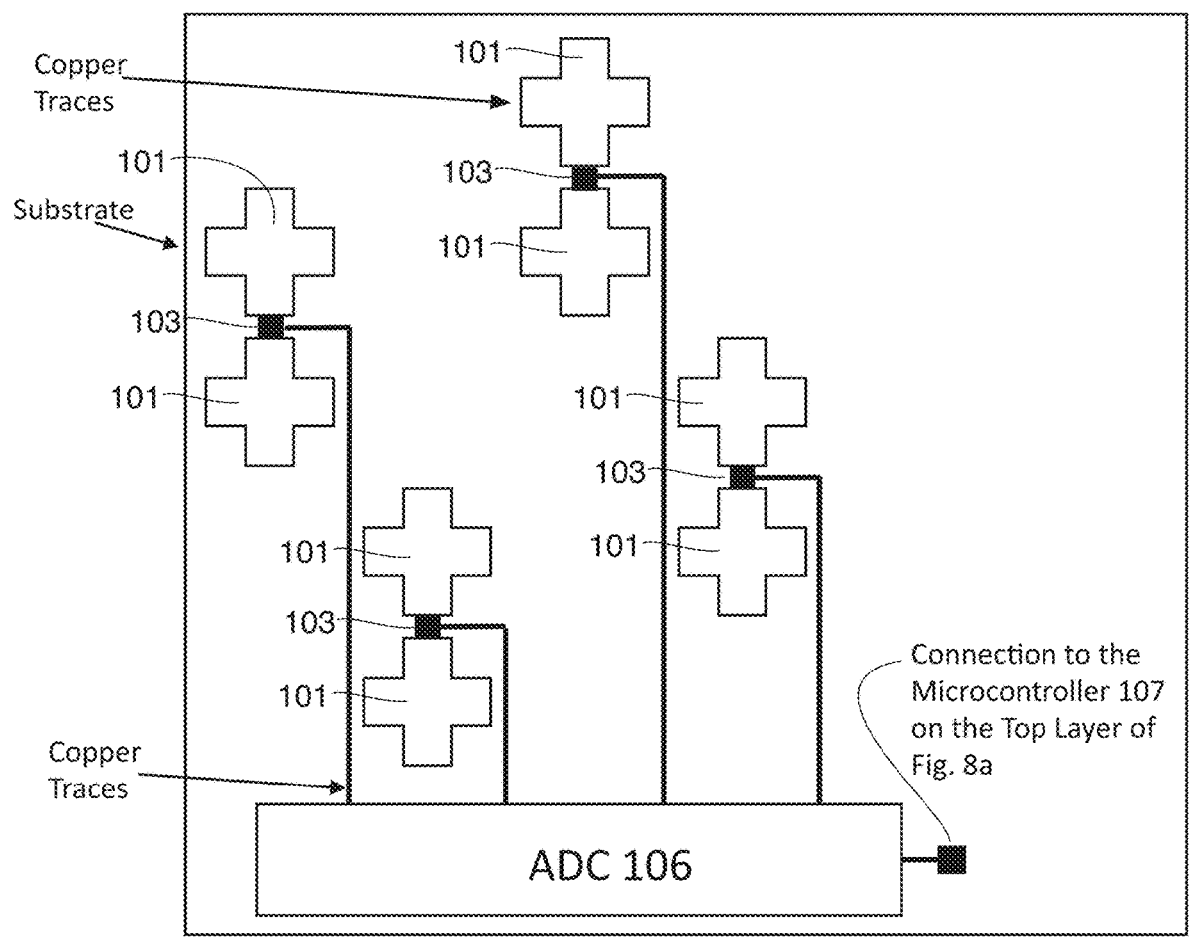

FIGS. 8a and 8b show the layers or substrates 102₁ and 102₂ of FIG. 7 in greater detail. In this embodiment, reactance tuning elements 104 are aperiodically mounted on one of these two layers (on layer 102₁ in this embodiment) and are connected to a digital to analog convertor (DAC) preferably mounted on the same layer (see FIG. 8a). Also preferably mounted on this layer is a microcontroller 107 which converts digital control signals from a microcontroller to analog voltages which in turn modify the reactance values of the aforementioned tuning elements through a network of thin copper traces. See also FIGS. 8a and 8b showing the traces in greater detail. High power sensing circuits are aperiodically mounted on the second layer preferably along with an analog to digital convertor (ADC). The analog inputs of this ADC are networked to these high power sensing circuits via a network of thin copper traces (again, see FIGS. 8a and 8b). The digital outputs of this ADC are routed to the microcontroller located on the top layer through a via connecting the two layers. The direction or bearing of high power interferers is determined using the high power sensing circuits integrated into the top layer. These high power sensing circuits are implemented using phased locked voltage controlled oscillators (PLL VCO) and mixers, which return relative phase and amplitude measurements (I&Q) from distinct points in the disclosed surface for adaptive antenna nulling to an integrated microcontroller. These vector measurements can then either be correlated with a known array manifold to determine the angle of arrival (AOA). Once this AOA is known, the microcontroller found on the top layer adjusts the reactance tuning elements on the bottom layer to place a null in the direction of the incoming radiation.

Figure 9:
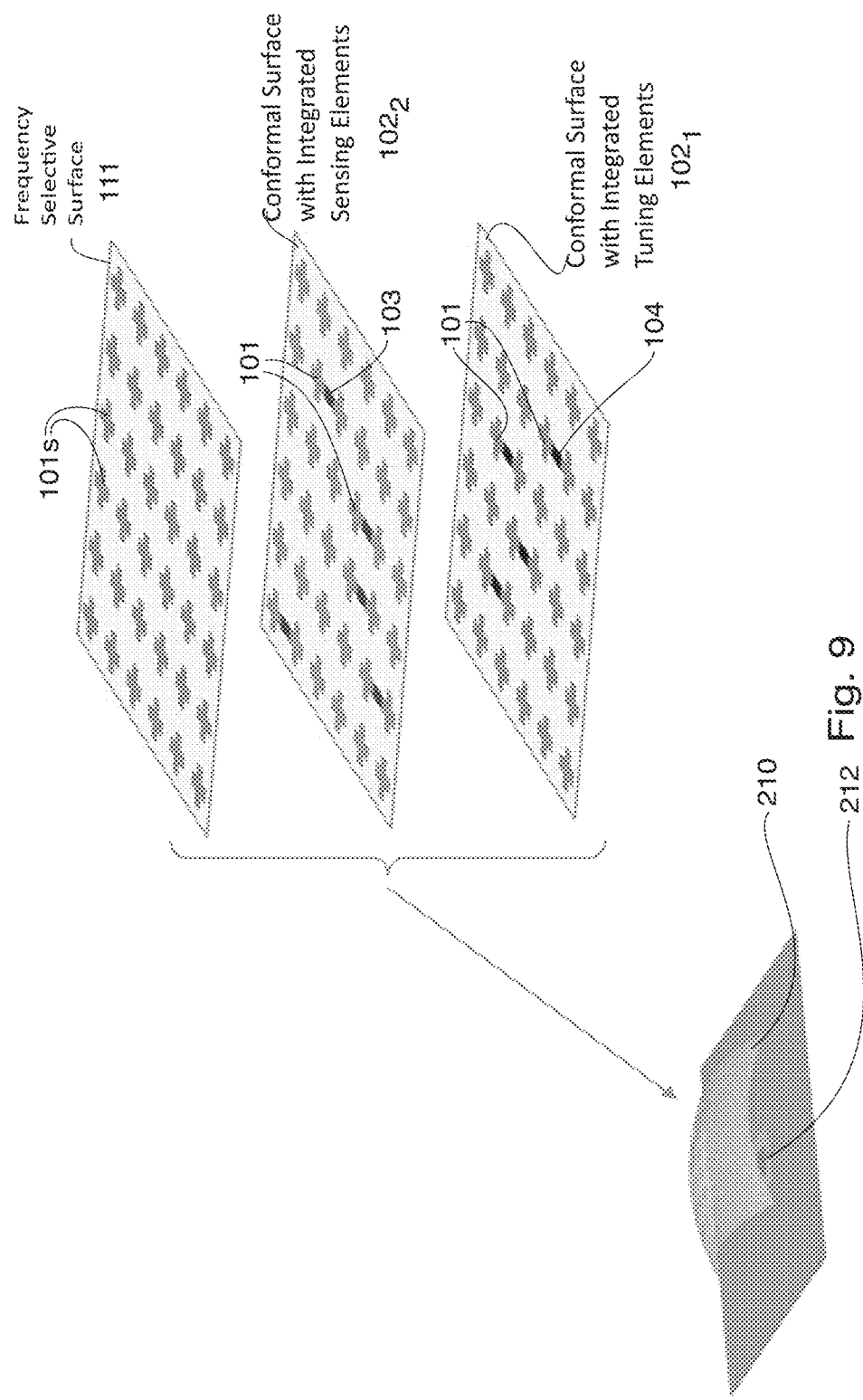
FIG. 9 depicts an embodiment of the surface for adaptive antenna nulling which comprises three distinct layers or substrates with two layers as in the embodiment of FIGS. 7, 8a and 8b, but with an additional FSS layer.

In a yet another embodiment (see FIG. 9), the surface for adaptive antenna nulling has three distinct layers or substrates 102₁, 102₂ and 111 which define the (possibly conformal) surface 210 for protecting antenna element 212. The top layer 111 in this embodiment is comprised of a periodic and subwavelength (less than one quarter wavelength in size and spacing) lattice of metallic scattering elements 101s such as but not limited to crossed metallic dipoles, mounted on a thin conformal substrate such as but not limited to Rogers RO4003, Rogers RO3003, Rogers RO5880, kapton, or PET. The scattering elements 101s may be identical (or different) in shape and size as the elements 101 utilized in layers in 102₁ and 102₂. This top layer 111 acts as a Frequency Selective Surface (FSS) to block out-of-band interference and radiation to provide further protection for the antenna (and its receiver) to be protected by this technology. The middle layer 102₂ and bottom layer 102₁ are each comprised of an array or lattice of metallic elements 101 (here depicted as crossed dipoles) disposed on a thin conformal substrate such as but not limited to Rogers RO4003, Rogers RO3003, Rogers RO5880, kapton, or PET. Reactance tuning elements 104 are aperiodically mounted on the bottom one of these three layers (layer 102₁) and are connected to a digital to analog convertor (DAC) preferably mounted on the same layer or embodied in the microcontroller. The DAC 108 converts digital control signals from or inside a microcontroller 107 to analog voltages which in turn modify the reactance values of the aforementioned tuning elements through a network of thin copper traces (see, for example, the prior embodiment of FIGS. 8a and 8b). RF sensing circuits 103 are aperiodically mounted on the middle layer 102₂ and are connected to an analog to digital convertor (ADC 106) which may be a stand alone element or may be embodied with the microcontroller 107. The analog inputs of the ADC 106 are networked to these RF sensing circuits 103 via a network of thin copper traces (see, for example, the embodiments FIGS. 8a and 8b). The digital outputs of this ADC 106 are routed to the microcontroller 107 preferably located on the middle layer through a via connecting the two layers if the ADC 106 is a stand alone element. The direction or bearing of high power interferers is determined using the high power sensing circuits integrated into the middle layer. These RF sensing circuits 103 are implemented using phased locked voltage controlled oscillators (PLL VCO) and mixers, which return relative phase and amplitude measurements (I&Q) from distinct points to an integrated microcontroller 107. These vector measurements can then either be correlated with a known array manifold to determine the angle of arrival (AOA). Once this AOA is known, the microcontroller found on the middle layer adjusts the reactance tuning elements on the bottom layer to place a null in the direction of the incoming radiation.

The scattering elements 101s of the FFS layer 111 are preferably non-sparsely (i.e., uniformly) located in an array and layer 111 periodically loaded with reactive elements between neighboring scattering elements 101s. The elements 101 of the middle layer 102₂ are preferably sparsely located in an array and the sensing elements 103 are connected to neighboring elements 101 of the middle layer 102₂. The depicted sensing elements 103 are aperiodic as depicted. The elements 101 of the middle layer 102₂ are depicted at each possible position of an element 101, but those elements 101 which are not directly coupled to a RF sensing element 103 may be omitted (as in embodiment of FIG. 1a) thereby rendering the array of elements 101 also sparse. So the in the middle layer 102₂ all but ten of the elements 101 may be omitted thereby reducing the number of remaining elements 101 to ten in number (those being the elements 101 directly coupled to a RF sensing element 103). The elements 101 of the bottom layer 102₁ are also preferably sparsely located in an array and they are aperiodically loaded with a different sensing element at each sensing element 104 location in the depicted array. The elements 101 of the middle layer 102₂ are depicted at each possible position of an element 101, but those elements 101 which are not directly coupled to a sensing element 104 may be omitted thereby rendering the array of elements 101 sparse in that layer as well. So, the in the bottom layer 102₁ all but eight of the elements 101 may be thereby reducing the number of remaining elements to eight (those being the elements 101 directly coupled to a RF sensing element 103).

Figure 10:
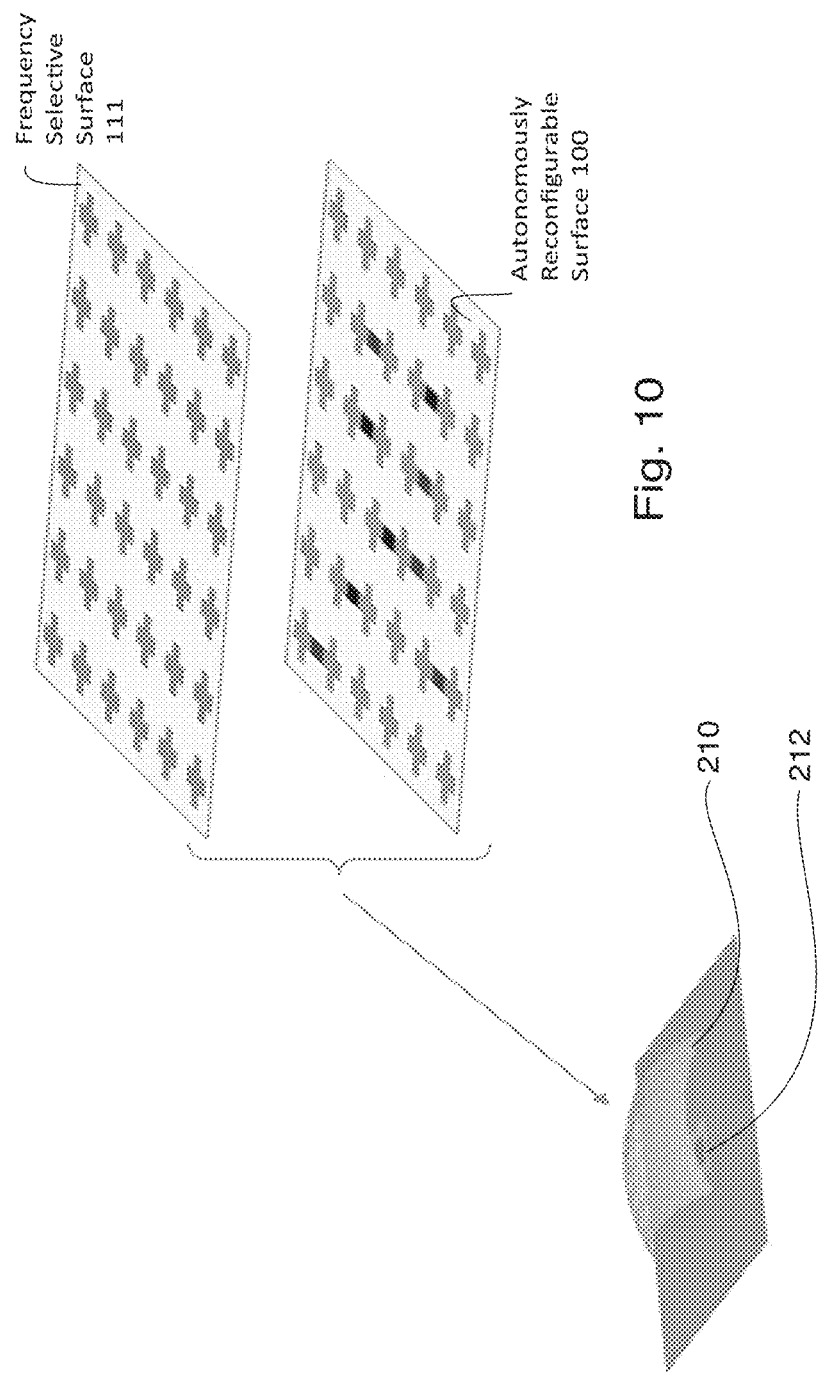
FIG. 10 depicts an embodiment of the surface for adaptive antenna nulling similar to the embodiment of FIG. 9, but in this embodiment two layers are formed on a single substrate.

In a still yet another embodiment (see FIG. 10), the present invention is embodied with two distinct layers 100 and 111 which define the (possibly conformal) surface 210 for protecting antenna element 212. The top layer 111 in this embodiment is comprised of a periodic and subwavelength (less than one quarter wavelength in size and spacing) lattice of scattering elements 101 such as but not limited to crossed metallic dipoles, mounted on a thin conformal substrate such as but not limited to Rogers RO4003, Rogers RO3003, Rogers RO5880, kapton, or PET. This top layer 111 acts as a frequency selective surface (FSS) to block out-of-band interference and radiation to provide further protection for the antenna (and its receiver) to be protected by this technology. The bottom layer 100 is comprised of a lattice of cross-shaped metallic dipoles 101 mounted on a thin conformal substrate such as but not limited to Rogers RO4003, Rogers RO3003, Rogers RO5880, kapton, or PET and aperiodically loaded with reactance tuning elements and RF sensing circuits as discussed with reference to FIGS. 1 and 1a. Also preferably mounted on this surface are analog to digital convertors (ADCs), digital to analog convertors (DACs), and microcontroller(s) (not shown). The analog outputs of the DACs are networked to reactance tuning elements 104 via a network of thin copper traces (not shown). The analog inputs of the ADCs are networked to high power sensing circuits via a network of thin copper traces. The digital outputs of ADCs and the digital inputs of DACs are networked to microcontroller(s) 107 (if need be) via a network of thin copper traces (see FIGS. 1 and 1a). The direction or bearing of high power interferers is determined using the high power sensing circuits integrated into the bottom layer. These high power sensing circuits are implemented using phased locked voltage controlled oscillators (PLL VCO) and mixers, which return relative phase and amplitude measurements (I&Q) from distinct points in the disclosed technology to an integrated microcontroller. These vector measurements can then either be correlated with a known array manifold to determine the angle of arrival (AOA). Once this AOA is known, the microcontroller adjusts the reactance tuning elements on the bottom layer to place a null in the direction of the incoming radiation.

Figure 13:
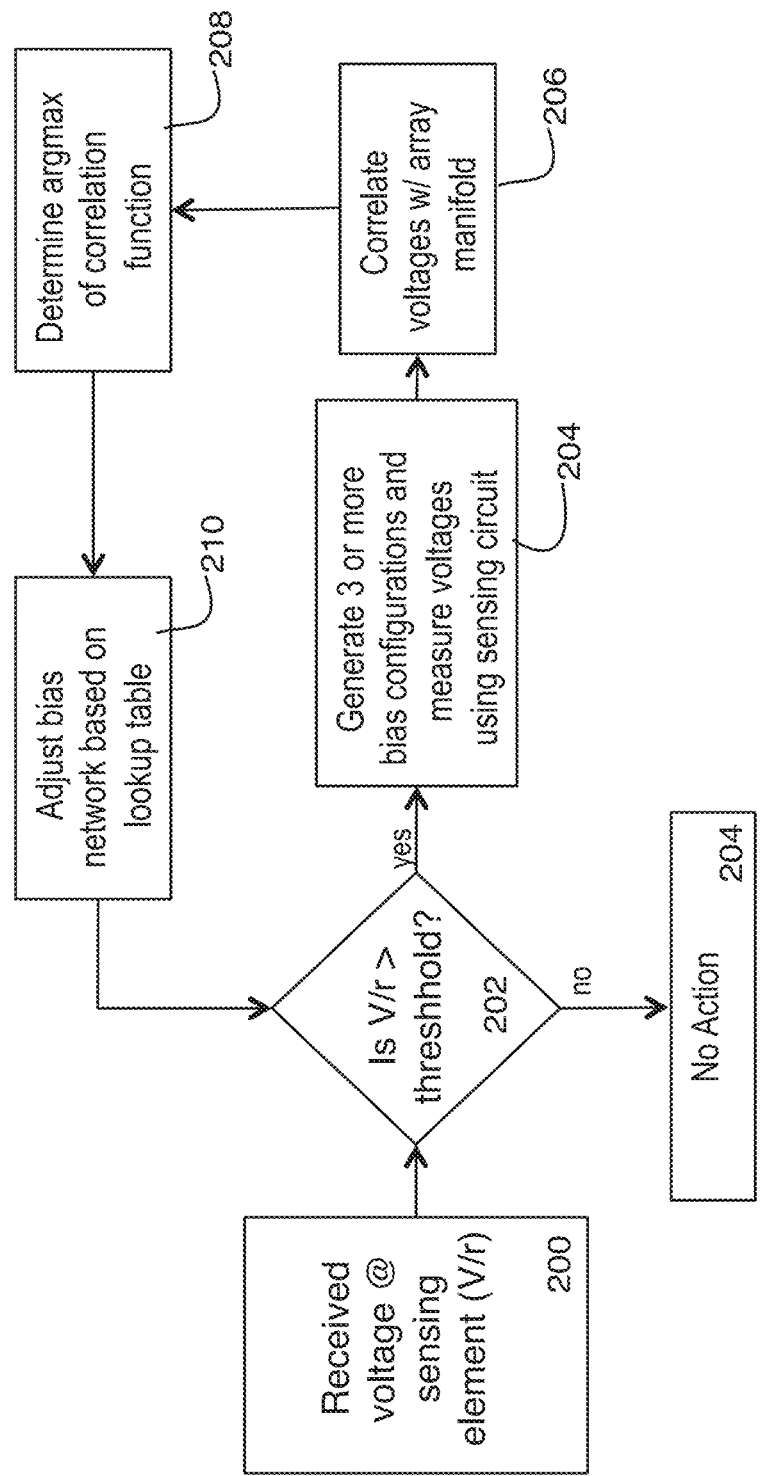
FIG. 13 is a flow chart of an embodiment of how the mircocontroller(s) may be programmed so that the null providing surface is autonomously reconfigurable.

FIG. 13 is a flow chart of an embodiment of how the microcontroller(s) 107 may be programmed so that the null providing surface 100 is autonomously reconfigurable. When the magnitude of the voltages received at any of the RF sensing elements 103 exceeds a pre-determined voltage threshold the control sequence loop shown in FIG. 13 is initiated. First, voltages (both amplitude and phase) are measured at each of the sensing elements (see block 200) and tested as meeting some predetermined threshold (see block 202). These voltage measurements are then correlated against the previously measured array manifold (see block 206). The argmax of the output of this correlation is taken to be the AoA of the incident high power wave (see block 208). This angle is then used with a lookup table to determine the appropriate bias condition to null the incident wave (see block 210). This bias condition is then implemented (see block 204). This process is then repeated (via "yes" output of block 202) until the magnitude of the voltages received at each of the sensing elements is less than the predetermined voltage threshold (via "no" output of block 202).

In the foregoing embodiments the metallic elements 101 are depicted in the formed of crosses or crossed dipoles. However, the metallic elements 101 need not necessarily assume the form of crosses or crossed dipoles; rather while the crossed dipole shape for the metallic elements 101 may be preferred, the metallic elements 101 may assume any convenient shape such as those depicted by FIG. 11 and others known in the art. The metallic elements 101 of FIG. 11 each have the same maximum width (w) and maximum height (h), but in some embodiments the maximum width (w) and maximum height (h) may be different and also may vary in size throughout an array of same.

The disclosed technology offers significant benefits to various airborne and maritime platforms containing sensitive navigation, communication, and sensing platforms. Furthermore, this technology has value to communications and sensor system programs and product lines which need protection against intentional and unintentional jamming.

In particular configurations, it may be desirable to have a smaller number of tuning elements 104 without any RF sensing elements 103, if direction finding is not critical. In other configurations, direction finding is critical and will require several RF sensing elements 103 to pin point the interferer(s). Based on the accuracy needed for the direction finding, size of the radome and number of interferers that must be dealt with, number of reactance tuning elements 104 and number of RF power sensing elements 103 will vary. But nevertheless it is desirable that they and the number of elements 101 be sparse (and this not occupy every possible unit cell) to reduce The disclosed technology can be applied to retrofit any existing antenna or a radiating aperture by adding this autonomously reconfigurable surface that serves as a conformal radome to provide for the needed adaptive antenna nulling to suppress high power interferers. This approach does not require any antenna or receiver redesign to protect from high energy jammers. Number of ADCs, DACs and microcontroller(s) needed to be integrated on the radome is a function of application and mission requirements and will vary from application to application. Alternatively, the disclosed technology can be applied to an antenna or a radiating aperture of new design by adding this autonomously reconfigurable surface into that design.

Modifications, additions, or omissions may be made to the systems, apparatuses, and methods described herein without departing from the scope of the inventive concepts. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A null-providing surface disposed between one or more antenna elements and an interfering source of RF energy comprising:
   a substrate disposed in a location between the one or more antenna elements and the interfering source of RF energy;
   an array of electrically conductive elements mounted on the substrate;
   tuning elements sparsely distributed in said array of electrically conductive elements and connected to selected pairs of the electrically conductive elements; and
   one or more microcontroller(s) mounted on or in the vicinity of the substrate;
   wherein the one or more microcontroller(s) control the tuning elements to provide a null with respect to the interfering source of RF energy.

2. The null-providing surface of claim 1, further comprising RF sensing elements sparsely distributed and electrically connected to other selected pairs of the electrically conductive elements.

3. The null-providing surface of claim 2, within the array of electrically conductive elements mounted on the substrate defines a sparse array where the array of electrically conductive elements is defined by an array of unit cells with only some of the unit cells being occupied by a single electrically conductive element and the remaining unit cells being occupied by no electrically conductive elements.

4. The null-providing surface of claim 3, further comprising one or more ADCs (Analog to Digital Converters) which are (i) located on the substrate and electrically connected to the RF sensing elements and the one or more microcontroller(s) or (ii) are embodied in the one or more microcontroller(s) that are electrically connected to the RF sensing elements.

5. The null-providing surface of claim 4, wherein the one or more ADCs are disposed near an edge of the substrate and connected to the RF sensing elements via electrically conductive traces on the substrate.

6. The null-providing surface of claim 1, further comprising one or more DACs (Digital to Analog Converters) which are (i) located on the substrate and electrically connected to the tuning elements and the one or more microcontroller(s) or (ii) are embodied in the one or more microcontroller(s) and are electrically connected to the tuning elements.

7. The null-providing surface of claim 6, wherein the one or more DACs are located near an edge of the substrate and connected to the tuning elements via electrically conductive traces on the substrate.

8. The null-providing surface of claim 1, wherein the substrate has a dielectric surface.

9. The null-providing surface of claim 1, wherein the electrically conductive elements are crossed dipoles.

10. The null-providing surface of claim 1 wherein the one or more microcontroller(s) control the tuning elements to provide a separate null for each interfering source of RF energy.

11. An antenna system comprising:
an antenna element; and
a reconfigurable surface radome disposed over the antenna element, the reconfigurable surface radome comprising an array of electrically conductive elements disposed on a substrate, tuning elements being sparsely distributed and located between selected pairs of the electrically conductive elements and electrically connected to said selected ones of the electrically conductive elements and one or more microcontroller(s) mounted on the substrate,
wherein the one or more microcontroller(s) control the tuning elements to provide at least one null in at least one direction pointing to an interferer while allowing normal operation at other directions not pointing to the interferer or to other interferers.

12. The antenna system of claim 11, further comprising sensing elements sparsely distributed and electrically connected to other selected pairs of the electrically conductive elements.

13. The antenna system of claim 12, further comprising one or more ADCs (Analog to Digital Converters) which are (i) located on the substrate and electrically connected to the sensing elements and the one or more microcontroller(s) or (ii) are embodied in the one or more microcontroller(s) and are electrically connected to the sensing elements.

14. The antenna system of claim 13, wherein the one or more ADCs are disposed along an edge of the substrate and connected to the sensing elements via thin copper traces on the substrate.

15. The antenna system of claim 11, further comprising one or more DACs (Digital to Analog Converters) which are (i) located on the substrate and electrically connected to the tuning elements and the one or more microcontroller(s) or (ii) are embodied in the one or more microcontroller(s) and are electrically connected to the tuning elements.

16. The antenna system of claim 15, wherein the one or more DACs are located along an edge of the substrate and connected to the tuning elements via thin copper traces on the substrate.

17. The antenna system of claim 11, wherein the substrate has a dielectric surface.

18. The antenna system of claim 11, wherein the electrically conductive elements are each embodied as a crossed dipole formed of copper.

19. The antenna system of claim 11, wherein the one or more microcontroller(s) are located along an edge of the substrate.

20. A method of adaptive nulling for an antenna system comprising:
mounting a surface radome over a receiving antenna;
disposing an array of electrically conductive elements on a substrate;
distributing tuning elements sparsely between selected pairs of the electrically conductive elements and electrically connecting the tuning elements to neighboring electrically conductive elements; and
disposing one or more microcontroller(s) on the substrate, wherein the one or more microcontroller(s) control the tuning elements to provide at least one null in a direction pointing to interferers while allowing normal operation at other directions.

21. The method of adaptive nulling according to claim 20, further comprising distributing sensing elements on the substrate and electrically connecting the sensing elements to other selected pairs of the electrically conductive elements.

22. The method of adaptive nulling according to claim 21, further comprising electrically connecting analog to digital converters (ADCs) between the sensing elements and a core of the one or more microcontroller(s).

23. The method of adaptive nulling according to claim 20, further comprising electrically connecting digital to analog converters (DACs) to the tuning elements and mounting the DACs on an edge of the substrate.

24. An autonomously reconfigurable null providing surface comprising an array of electrically conductive elements disposed on or in a substrate, reactive tuning elements sparsely distributed and located between selected pairs of electrically conductive elements and electrically connected to the selected pairs of electrically conductive elements on both ends of each reactive tuning element and electrically connected to one or more microcontroller(s) mounted on the substrate, wherein the one or more microcontroller(s) control the reactive tuning elements to provide nulls in one or more direction(s) pointing to one or more interfering source(s) of RF energy, while allowing normal operation at other directions.

25. The autonomously reconfigurable null providing surface of claim 24 wherein the electrically conductive elements are uniformly sized and wherein the substrate is subdividable into a plurality of unit cells of sufficient size to contain one such uniformly sized electrically conductive element, but wherein said electrically conductive elements are sparely distributed on or in said substrate such that only selected ones of said unit cells contain one of said electrically conductive elements.

26. The autonomously reconfigurable null providing surface of claim 25 wherein the substrate is subdividable into a plurality M rows and N columns of said unit cells and wherein a total number of said unit cells which contain one of said electrically conductive elements is less than M times N.

27. The autonomously reconfigurable null providing surface of claim 26 wherein a total number of said reactive tuning elements sparsely distributed and located between the selected pairs of electrically conductive elements is less than (M−1) times (N−1).

28. The autonomously reconfigurable null providing surface of claim 27 wherein the one or more microcontroller(s) are also coupled with a plurality of sparsely distributed RF power sensors disposed on or in said substrate.

29. The autonomously reconfigurable null providing surface of claim 28 wherein the RF power sensors and the reactance tuning elements are randomly or pseudo-randomly distributed across said substrate.

30. The autonomously reconfigurable null providing surface of claim 24 wherein the reactance tuning elements are randomly or pseudo-randomly distributed across said substrate.

* * * * *